(12) United States Patent
Chen et al.

(10) Patent No.: US 11,211,469 B2
(45) Date of Patent: Dec. 28, 2021

(54) THIRD GENERATION FLASH MEMORY STRUCTURE WITH SELF-ALIGNED CONTACT AND METHODS FOR FORMING THE SAME

(71) Applicant: Taiwan Semiconductor Manufacturing Company Limited, Hsinchu (TW)

(72) Inventors: Jhih-Bin Chen, Hsinchu (TW); Ming Chyi Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/885,351

(22) Filed: May 28, 2020

(65) Prior Publication Data

US 2021/0376120 A1     Dec. 2, 2021

(51) Int. Cl.
*H01L 29/66*       (2006.01)
*H01L 29/423*      (2006.01)
*H01L 29/788*      (2006.01)
*H01L 27/11521*    (2017.01)
*H01L 27/11526*    (2017.01)
(Continued)

(52) U.S. Cl.
CPC ...... *H01L 29/66515* (2013.01); *H01L 21/266* (2013.01); *H01L 21/26513* (2013.01); *H01L 21/28518* (2013.01); *H01L 27/11521* (2013.01); *H01L 27/11526* (2013.01); *H01L 29/42328* (2013.01); *H01L 29/45* (2013.01);
(Continued)

(58) Field of Classification Search
CPC ............. H01L 29/66515; H01L 29/665; H01L 27/11521; H01L 27/11526; H01L 21/28518; H01L 29/45; H01L 29/7883; H01L 29/42328; H01L 29/66825; H01L 21/26513; H01L 21/266
See application file for complete search history.

(56) References Cited

U.S. PATENT DOCUMENTS 8,264,030 B2     9/2012  Kwon
9,196,748 B2 *  11/2015  Saito ................. H01L 29/40117
(Continued)

FOREIGN PATENT DOCUMENTS

TW     201926653 A     7/2019
TW     202006804 A     2/2020

OTHER PUBLICATIONS

Taiwan Patent and Trademark Office, Application No. 109132046 Examination Report dated Jun. 21, 2021, 6 pages.

*Primary Examiner* — David Vu
(74) *Attorney, Agent, or Firm* — The Marbury Law Group, PLLC

(57) ABSTRACT

A memory device and method of making the same are disclosed. The memory device includes a first split gate memory cell including a first memory stack located over a substrate. The first memory stack includes a first floating gate and a first control gate located above the first floating gate. The split gate memory cell also includes a first select gate located adjacent to the first floating gate and the first control gate and a contact etch stop located over a portion of a top surface of the first select gate. The contact etch stop enables a narrowing of the drain contact via during an etch process. By narrowing the drain contact via, the density of split gate memory cells may be increased.

20 Claims, 31 Drawing Sheets

(51) Int. Cl.
*H01L 21/265* (2006.01)
*H01L 21/266* (2006.01)
*H01L 21/285* (2006.01)
*H01L 29/45* (2006.01)

(52) U.S. Cl.
CPC ...... *H01L 29/665* (2013.01); *H01L 29/66825* (2013.01); *H01L 29/7883* (2013.01)

(56) References Cited

U.S. PATENT DOCUMENTS

2017/0062443 A1* 3/2017 Mizushima ....... H01L 29/42328
2018/0102414 A1 4/2018 Liu et al.
2018/0315765 A1 11/2018 Lin et al.

* cited by examiner

THIRD GENERATION FLASH MEMORY STRUCTURE WITH SELF-ALIGNED CONTACT AND METHODS FOR FORMING THE SAME

BACKGROUND

The semiconductor integrated circuit (IC) industry has experienced exponential growth over the last few decades. Over the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable system-on-chip (SOC) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
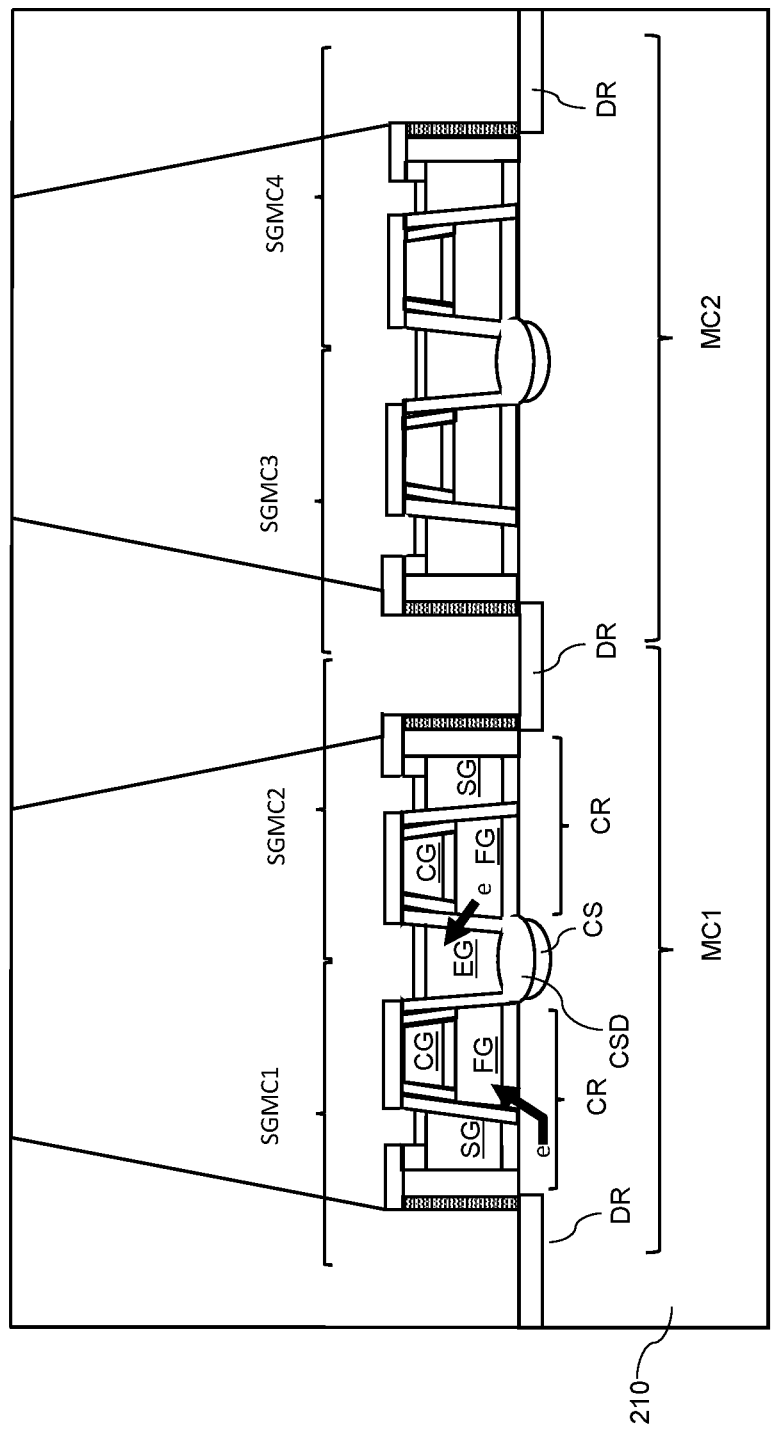
FIG. 1 is a vertical cross-sectional view of split-gate flash memory cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a vertical cross-sectional view of ESF3 memory cells (MC1 and MC2), or so-called "third generation SUPERFLASH" memory cell in accordance with some embodiments. For example, the ESF3 memory cell MC1 includes a pair of symmetric split gate memory cells SGMC1, SGMC2, each of which includes source region CS, drain region DR and a channel region CR arranged there between. In the ESF3 architecture, the source regions CS for each of the split gate memory cells SGMC1, SGMC2 may be a common source region CS shared with its neighboring cell. Each split gate memory cell (e.g., SGMC1 and SGMC2) may have its own drain region DR. One of ordinary skill in the art would understand that the source regions CS may also be designated the drain regions DR. Thus, in other embodiments, the neighboring split gate memory cells may also share a common drain region DR.

Within each split gate cell SGMC1, SGMC2, a floating gate FG may be arranged over the channel region CR of the split gate cell SGMC1, SGMC2. Further, a control gate CG may be arranged over the floating gate FG. A select gate SG may be arranged on one side of the floating gate FG and control gates CG (e.g., between an individual source/drain region CS, DR of the ESF3 memory cell MC and a sidewall of the floating gate FG and/or control gate CG). An erase gate EG may be arranged over a common source/drain region CS between the split gate cells SGMC1 and SGMC2. At least one split gate cell SGMC1, SGMC2 may be configured to store a variable charge level on its floating gate FG, wherein the level of this charge corresponds to a data state stored in the cell split gate cell SGMC1, SGMC2 and may be stored in a non-volatile manner so that the stored charge/data persists in the absence of power.

A typical flash memory cell uses a floating gate FG to store a bit by the presence or absence of a charge. If the floating gate FG is not charged (i.e. neutral), then the device operates almost like a normal MOSFET, e.g. a positive charge in the control gate CG creates a channel CR in the p-substrate that carries a current from source CS to drain region DR. However, if the floating gate FG is negatively charged, then this charge shields the channel region CR somewhat from the control gate CG and prevents the formation of a channel between source CS and drain DR. The threshold $V_{th}$ voltage is the voltage applied to the control gate CG at which a transistor becomes conductive. The presence or the absence of a charge results in a more positive or more negative threshold voltage $V_{th}$. With reference to flash memory terms, programming (putting electrons into the floating gate FG) means writing a 0, erasing (removing the charge from the floating gate FG) means resetting the flash memory contents to 1; or in other words: a programmed cell stores a logic 0, an erased (a.k.a. flashed) split gate memory cell SGMC1, SGMC2 stores a logic 1.

Embodiments of the present disclosure are drawn to flash memory structures with self-aligned contacts and methods of making these structures. Specifically, in the self-aligned process, a hard mask may be used in the fabrication of the split gate memory cells SGMC1, SGMC2 to form contact etch stops. The presence of the contact etch stops may reduce the width of the drain contact via (and ultimately the width of the drain contact) between the split gate memory cells SGMC1, SGMC2 that is formed through a selective etching process. By using a self-aligned process to make the drain contacts, EFS3 memory devices may be fabricated in which pairs of split gate memory cells SGMC1, SGMC2 of an EFS3 memory cell MC1 may be formed closer to adjacent pairs of split gate memory cells SGMC1, SGMC2 as compared to split gate memory cells of an EFS3 memory cell that are formed without using a self-aligned process and contact etch stops. Thus, the EFS3 memory device disclosed herein may operate faster than a conventionally formed EFS3 memory device because the carriers have a shorter distance to travel to and within the EFS3 memory cells MC1, MC2. Further, the disclosed embodiment EFS3 memory devices may be made smaller than a conventionally formed EFS3 memory device because the disclosed embodiment EFS3 memory cells MC1, MC2 may be formed closer to one another. In addition, the better alignment of the self-alignment process may produce and more reliable split gate memory cells SGMC1, SGMC2 than memory cells made without them.

FIGS. 2 to 26 are vertical cross-sectional views at different stages of the method 100 for manufacturing the semiconductor device in accordance with some embodiments. It is understood that additional steps may be implemented before, during, or after the method 100, and some of the steps described may be replaced or eliminated for other embodiments of the method 100.

Figure 2:
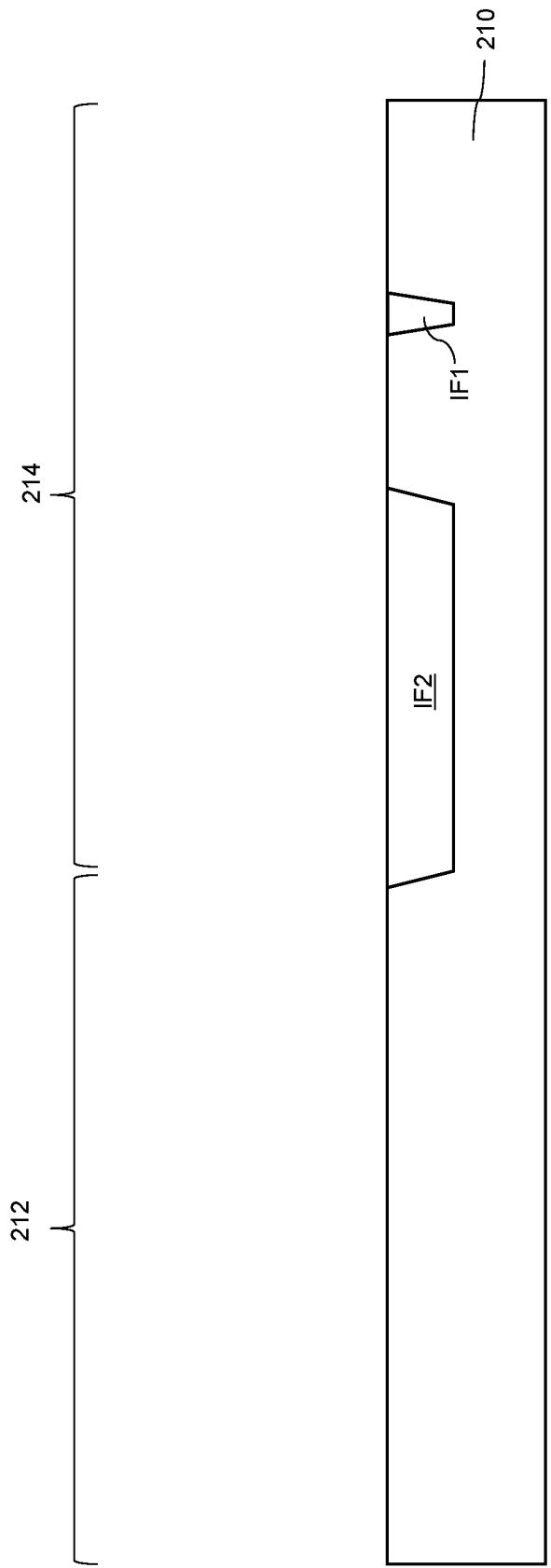
FIG. 2 is a vertical cross-sectional view illustrating a step of forming isolation features in a method for fabricating a semiconductor device in accordance with some embodiments.

Referring to FIG. 2, a substrate 210 may be provided. In some embodiments, the substrate 210 may be a substrate, such as a bulk silicon substrate, a germanium substrate, a compound substrate, or other suitable substrate. The substrate 210 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 210 may include a memory region 212, a peripheral region 214. The peripheral region 214 may be located such that it surrounds the memory region 212.

The substrate 210 may include isolation features IF1 and IF2 formed in the substrate 210. Shallow trench isolation structures IF1 and IF2 may be formed in an upper portion of the substrate 210. For example, shallow trenches having a depth in a range from 50 nm to 500 nm may be formed through the top surface of the substrate 210 by applying and patterning a photoresist layer over the top surface of the substrate 210, and by transferring the pattern in the photoresist layer into the upper portion of the substrate 210 using an anisotropic etch process. If a positive photoresist is used, portions of the photoresist to be removed may be developed by exposure to UV light. If a negative photoresist is used, portions of the photoresist which intended to act as a mask may developed by exposure to UV light. In both cases, the trenches may be etched after the photoresist is patterned, such as by wet etching. The photoresist layer may be subsequently removed, for example, by ashing. A dielectric material may be deposited in the shallow trenches, and excess portions of the dielectric may be removed from above the horizontal plane including the top surface of the substrate 210 using a planarization process such as a chemical mechanical polishing (CMP) process. The remaining portions of the dielectric material that fill the shallow trenches comprise the shallow trench isolation structures IF1 and IF2. In some embodiments, the dielectric material may include oxide and/or other dielectric materials. Optionally, a liner oxide (not shown) may be formed in the trenches. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other CVD methods. A chemical mechanical polish (CMP) may then be performed to substantially level the top surface of the dielectric material with the top surfaces of the substrate 210 to form a plurality of isolation features IF1 and IF2 in the trenches. The formation of the liner oxide may reduce the electrical fields and hence improves the performance of semiconductor devices that may be subsequently formed on substrate 210. It is noted that while the figures illustrate a single isolation feature IF1, embodiments within the contemplated scope of disclosure may include a plurality of isolation features IF1.

Figure 3:
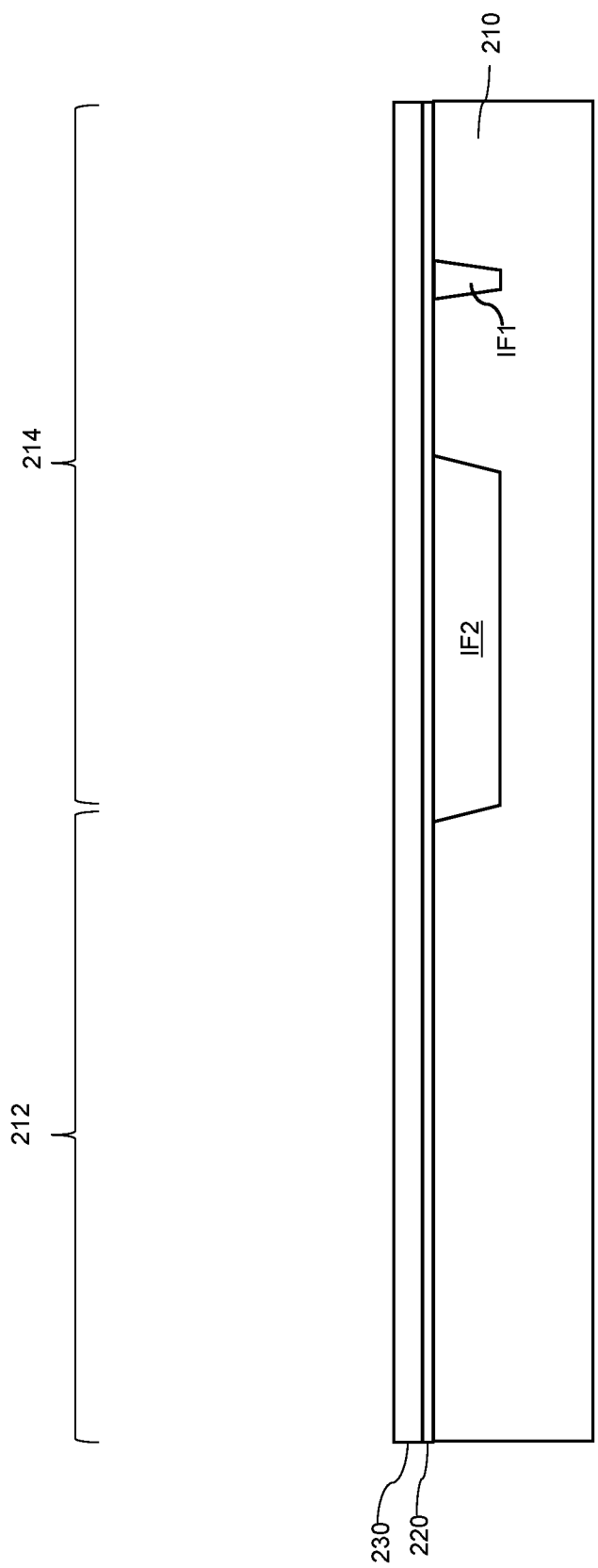
FIG. 3 is a vertical cross-sectional view illustrating a step of forming a tunnel dielectric layer, and floating gate layer in a method for fabricating a semiconductor device in accordance with some embodiments.

Referring to FIG. 3, a tunneling layer 220 may formed over the substrate 210 and isolation features IF1 and IF2. A floating gate layer 230 may be formed over the tunneling layer 220. The tunneling layer 220 may include, for example, a dielectric material such as silicon dioxide ($SiO_2$), silicon nitride ($Si_3N_4$), silicon oxynitride (SiON), high-k materials, other non-conductive materials, or combinations thereof. Other suitable dielectric materials are within the contemplated scope of disclosure. The tunneling layer 220 may be deposited using thermal oxidation, ozone oxidation, other suitable processes, or combinations thereof. The floating gate layer 230 may include polysilicon. The floating gate layer 230 may include polysilicon deposited through, for example low pressure CVD (LPCVD) methods, CVD methods and PVD sputtering methods employing suitable silicon source materials. In some embodiments, the floating gate layer 230 may be ion implanted. In other embodiments, the floating gate layer 230 may be include metal, metal alloys, single crystalline silicon, or combinations thereof. In an embodiment, a polysilicon layer may be conformally formed over the tunneling layer 220, and then a CMP process may be performed to remove a portion of the polysilicon layer, such that a remaining portion of the polysilicon layer (i.e. the floating gate layer 230) may be planarized.

Figure 4:
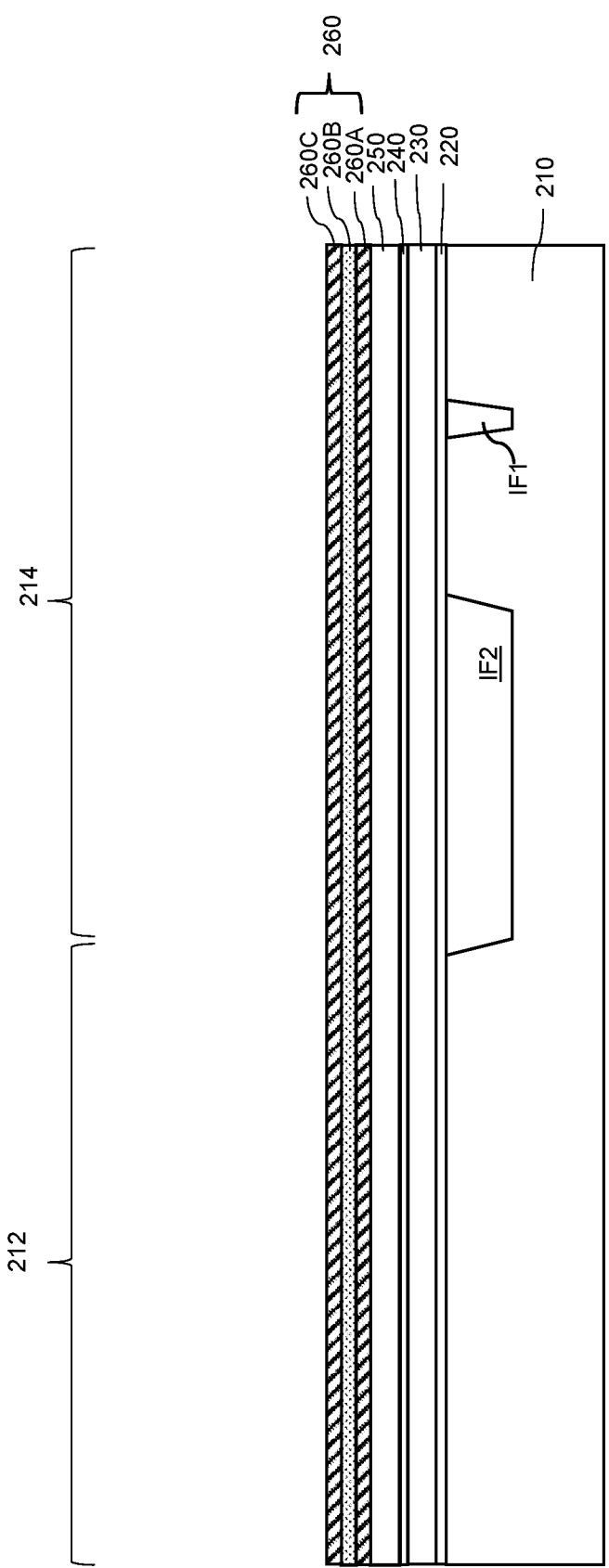
FIG. 4 is a vertical cross-sectional view illustrating a step of forming a blocking dielectric layer, a control gate layer and a hard mask layer in a method for fabricating a semiconductor device in accordance with some embodiments.

Referring to FIG. 4, a blocking layer 240, a control gate layer 250, and a hard mask layer 260 may be formed over the substrate 210, tunneling layer 220, and floating gate layer 230. The blocking layer 240 may be conformally formed over the floating gate layer 230. In some embodiments, the blocking layer 240 and the tunneling layer 220 may be formed of the same material. In other embodiments, the blocking layer 240 and the tunneling layer 220 may be formed of different materials. That is, the blocking layer 240 may include, for example, a dielectric material such as silicon dioxide ($SiO_2$), silicon nitride ($Si_3N_4$), silicon oxynitride (SiON), high-k materials, other non-conductive materials, or combinations thereof. Other suitable dielectric materials are within the contemplated scope of disclosure. The blocking layer 240, control gate layer 250, and hard mask layer 260 may be each formed using chemical vapor deposition (CVD), physical vapor deposition (PVD), atomic layer deposition (ALD), ozone oxidation, other suitable processes, or combinations thereof.

The control gate layer 250 may be conformally formed over the blocking layer 240. The control gate layer 250 may include polysilicon. In some embodiments, the control gate layer 250 may be ion implanted. In some other embodiments, the control gate layer 250 may be made of metal, metal alloys, single crystalline silicon, or combinations thereof. In some embodiments, the control gate layer 250 may be thicker than the floating gate layer 230.

The hard mask layer 260 may be conformally formed over the control gate layer 250. In some embodiments, as illustrated in FIG. 4, the hard mask layer 260 may include SiN/$SiO_2$/SiN 260A, 260B, 260C stacked layers or other suitable materials. In other embodiments (not shown), the hard mask layer 260 may be formed as a single layer. The single layer of the hard mask layer 260 may include SiN. However, other suitable materials are within the contemplated scope of disclosure.

Figure 5:
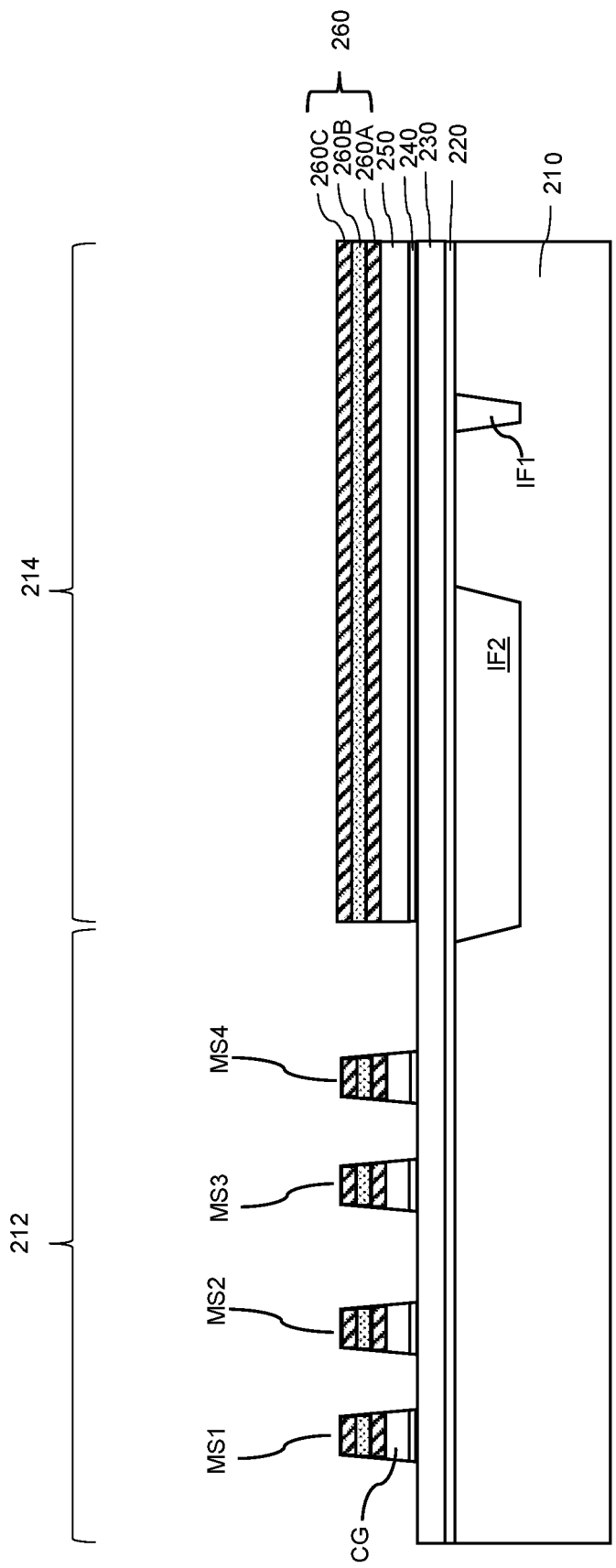
FIG. 5 is a vertical cross-sectional view illustrating a step of patterning control gates in a method for fabricating a semiconductor device in accordance with some embodiments.

Referring to FIG. 5, a photoresist (not shown) may be applied and patterned over the top surface of the hard mask layer 260, and by transferring the pattern in the photoresist layer into the hard mask layer 260, the control gate layer 250 and the blocking layer 240 using an anisotropic etch process. The photoresist layer may be subsequently removed, for example, by ashing. The patterning and etching of the hard mask layer 260, the control gate layer 250 and the blocking layer 240 may form memory stacks MS1-MS4 within the memory region 212 of the substrate 210 and a layer stack over the peripheral region 214. In the embodiment illustrated in FIG. 5, the memory stacks MS1-MS4 may each include a blocking layer 240, a patterned control gate layer 250 which may subsequently form a control gate CG, and a hard mask layer 260. As noted above, and as illustrated in FIG. 5, the hard mask layer 260 may include includes SiN/SiO$_2$/SiN (260A, 260B, 260C) stacked layers or other suitable materials.

Figure 6:
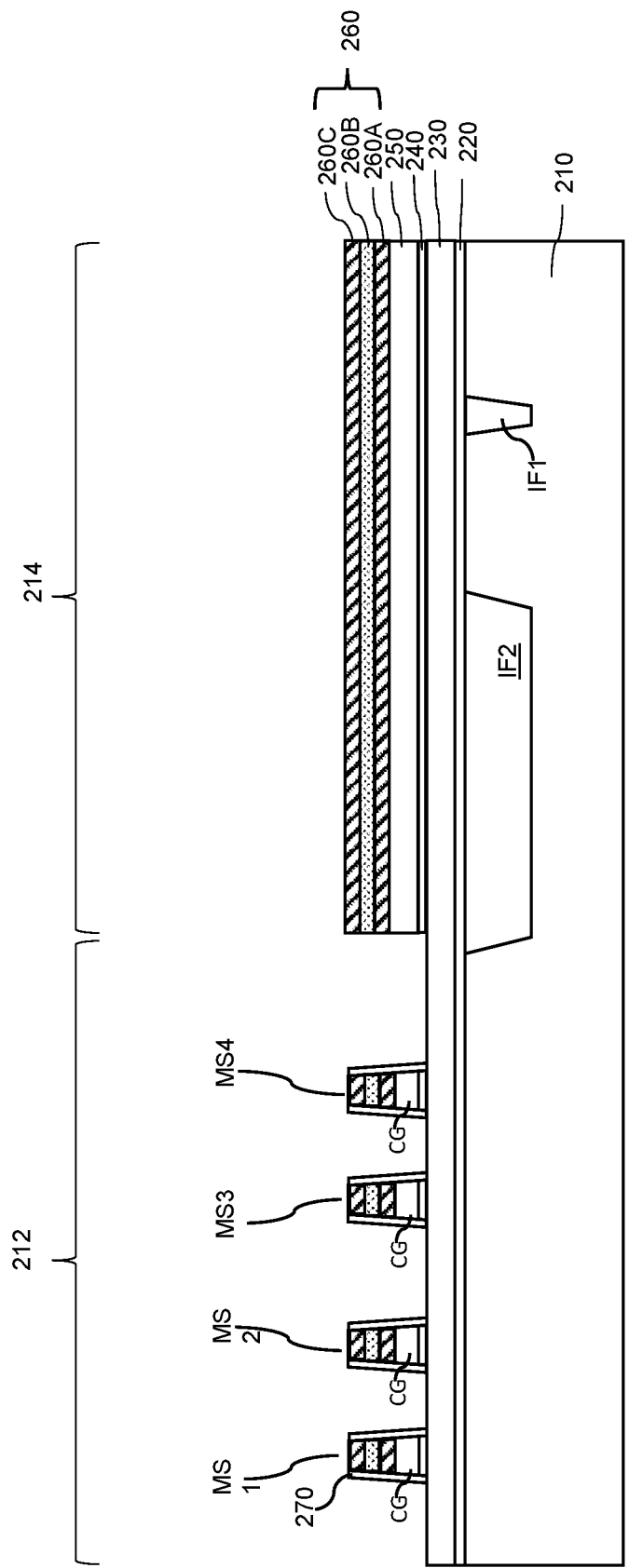
FIG. 6 is a vertical cross-sectional view illustrating a step of forming sidewall on control gate in a method for fabricating a semiconductor device in accordance with some embodiments.

Referring to FIG. 6, at least one dielectric material such as silicon nitride and/or silicon oxide may be conformally deposited over the memory stack structures (MS1-MS4). The at least one dielectric material may be anisotropic etched (for example, by a reactive ion etch process) to remove horizontal portions. Each remaining vertical portion that laterally surrounds a respective memory stack structures (MS1-MS4) comprises a sidewall spacer 270, which includes the at least one dielectric material. While only a single sidewall spacer 270 is illustrated for a memory stack structures (MS1-MS4), embodiments are expressly contemplated herein in which multiple sidewall spacers are formed on a memory stack structures (MS1-MS4) by sequentially depositing and anisotropically etching multiple dielectric materials.

Figure 7:
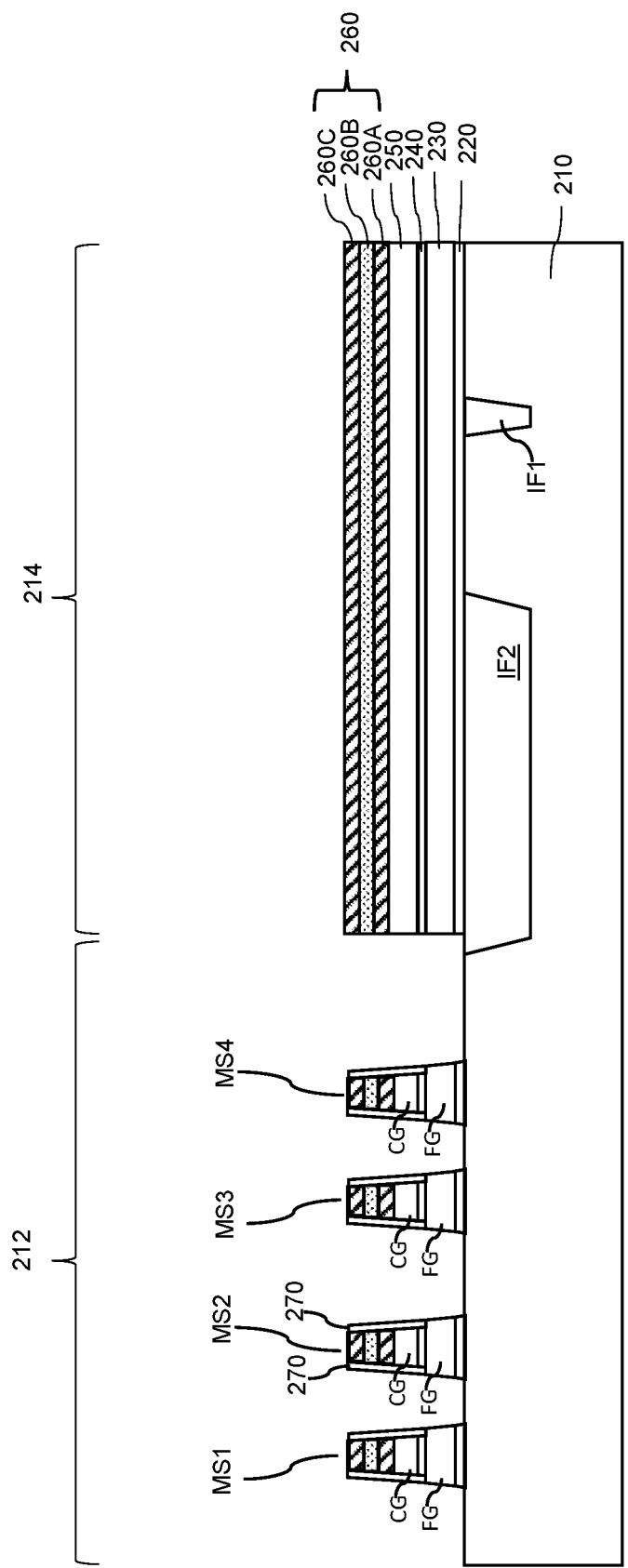
FIG. 7 is a vertical cross-sectional view illustrating a step of patterning floating gates in a method for fabricating a semiconductor device in accordance with some embodiments.

Referring to FIG. 7, the tunneling layer 220 and the floating gate layer 230 may be patterned such that the memory stacks MS1-MS4 include a patterned floating gate layer 230 forming a floating gate FG and a patterned tunneling layer 220. Thus, at this point in the fabrication process, each of the memory stacks MS1-MS4 may include patterned tunneling layer, floating gate FG, patterned blocking layer 240, control gate CG and patterned hard mask layer 260.

Figure 8:
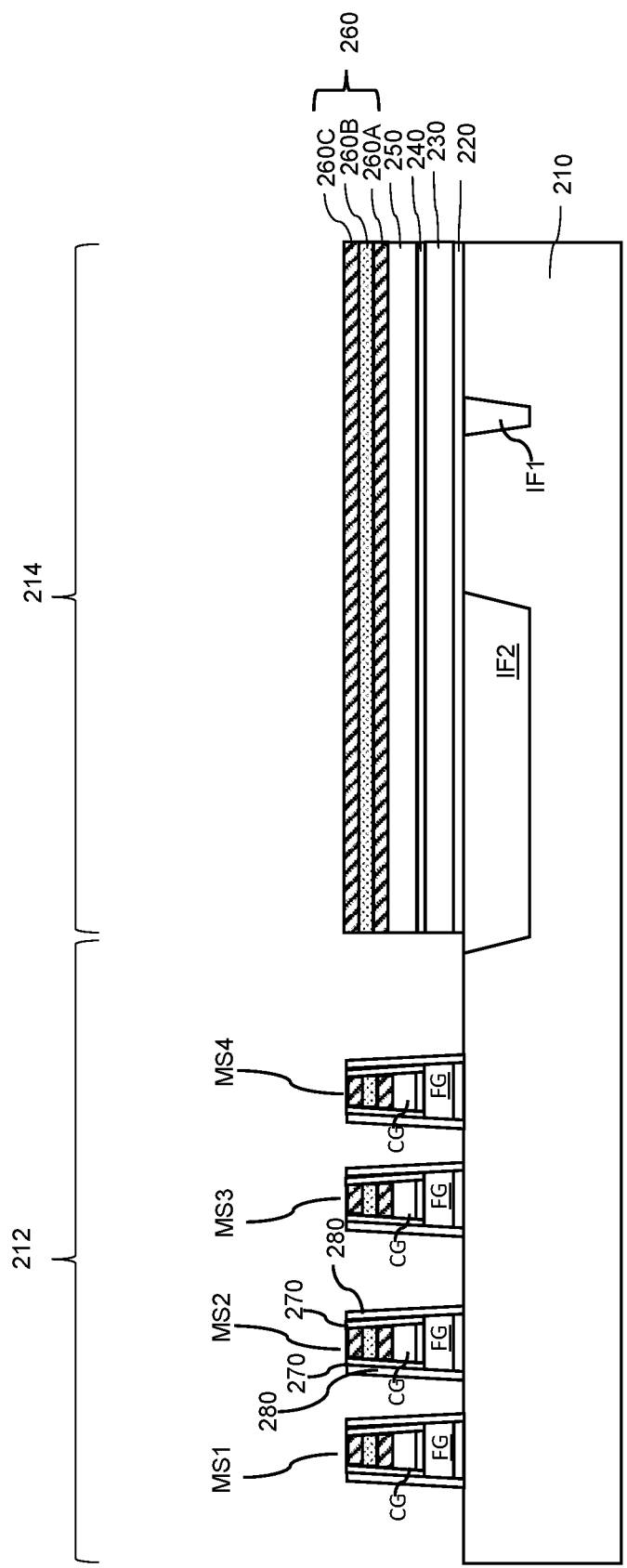
FIG. 8 is a vertical cross-sectional view illustrating a step of forming inter-gate dielectric layers in a method for fabricating a semiconductor device in accordance with some embodiments.

Referring to FIG. 8, an inter-gate dielectric layer 280 may be formed over the sidewalls of the memory stacks MS1-MS4 in a similar manner as described above with respect to sidewall spacers 270. As illustrated in FIG. 8, the inter-gate dielectric layer 280 may be formed over the sidewall spacers 270 and the sidewalls of the floating gates FG and the patterned tunneling layer 220. In some embodiments, the inter-gate dielectric layers 280 may include an oxide, the combination of oxide, nitride and oxide (ONO), and/or other dielectric materials. In some embodiments, formation of the inter-gate dielectric layers 280 includes, for example, depositing a blanket layer of dielectric material over the substrate 210 and then performing an etching process to remove the horizontal portions of the blanket layer, while remaining vertical portions of the blanket layer may serve as the inter-gate dielectric layers 280.

Figure 9:
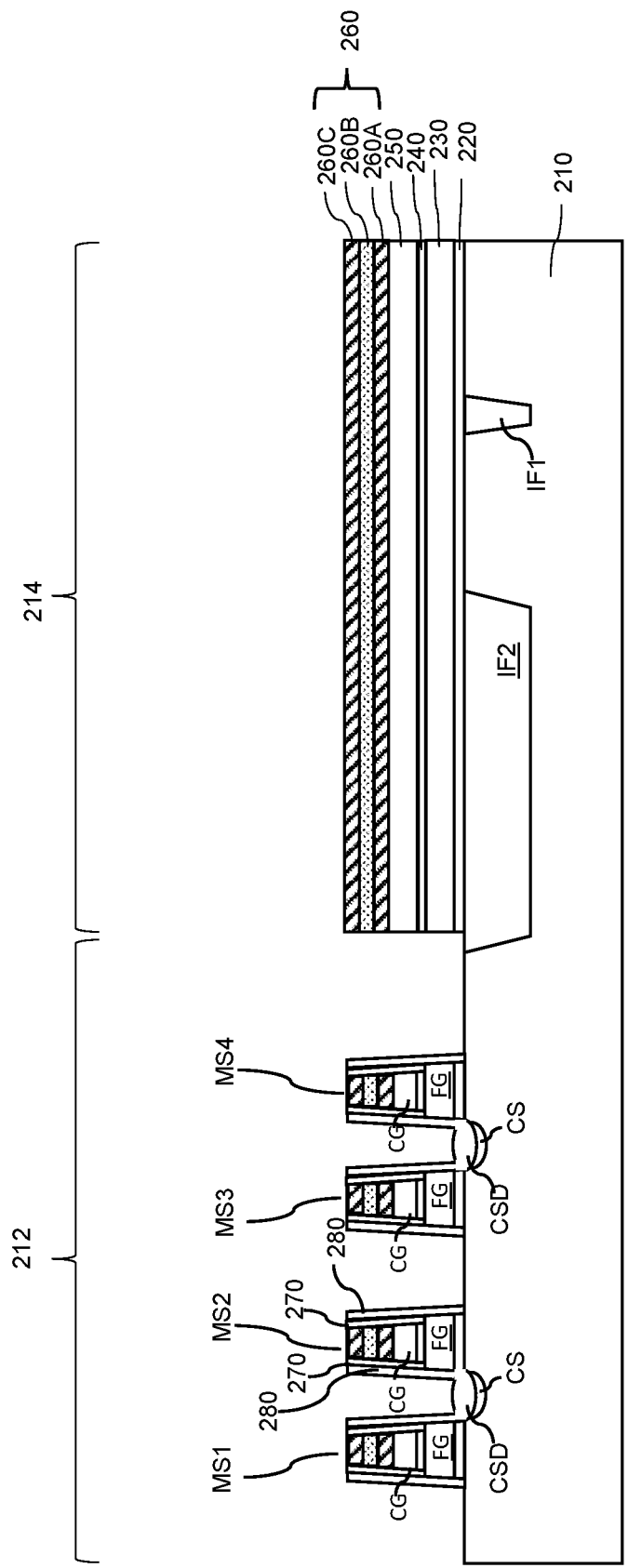
FIG. 9 is a vertical cross-sectional view illustrating a step of forming common source in a method for fabricating a semiconductor device in accordance with some embodiments.

Referring to FIG. 9, a common source region CS may be formed in the exposed portion of the substrate 210 between the memory stacks MS1 and MS2 and between memory stacks MS3 and MS4. In an embodiment, ions may be implanted into an exposed portion of the substrate 210 to form the common source region CS. The memory stacks MS1 and MS2 may share a common source region CS. Further, memory stacks MS3 and MS4 may share a common source region CS. As noted above, one of ordinary skill in the art may recognize that while the figures illustrate a common source region CS formed between memory stacks MS1 and MS2 (or between MS3 and MS4), the common source may also be referred to as a common drain DR. A common source dielectric layer CSD may be formed over the common source CS. The common source dielectric layer CSD may be made of silicon oxide. The common source dielectric layer CSD may be formed over the source regions CS using, for example, oxidation, CVD, other suitable deposition, or the like. In some embodiments, formation of the common source dielectric layer CSD (e.g., oxidation or deposition) includes depositing a layer dielectric material and etching portions of the dielectric layer not located between the memory stacks MS1, MS2 or MS3, MS4 such that the remaining portion of the dielectric layer forms the common source dielectric layer CSD over the common source region CS.

Figure 10:
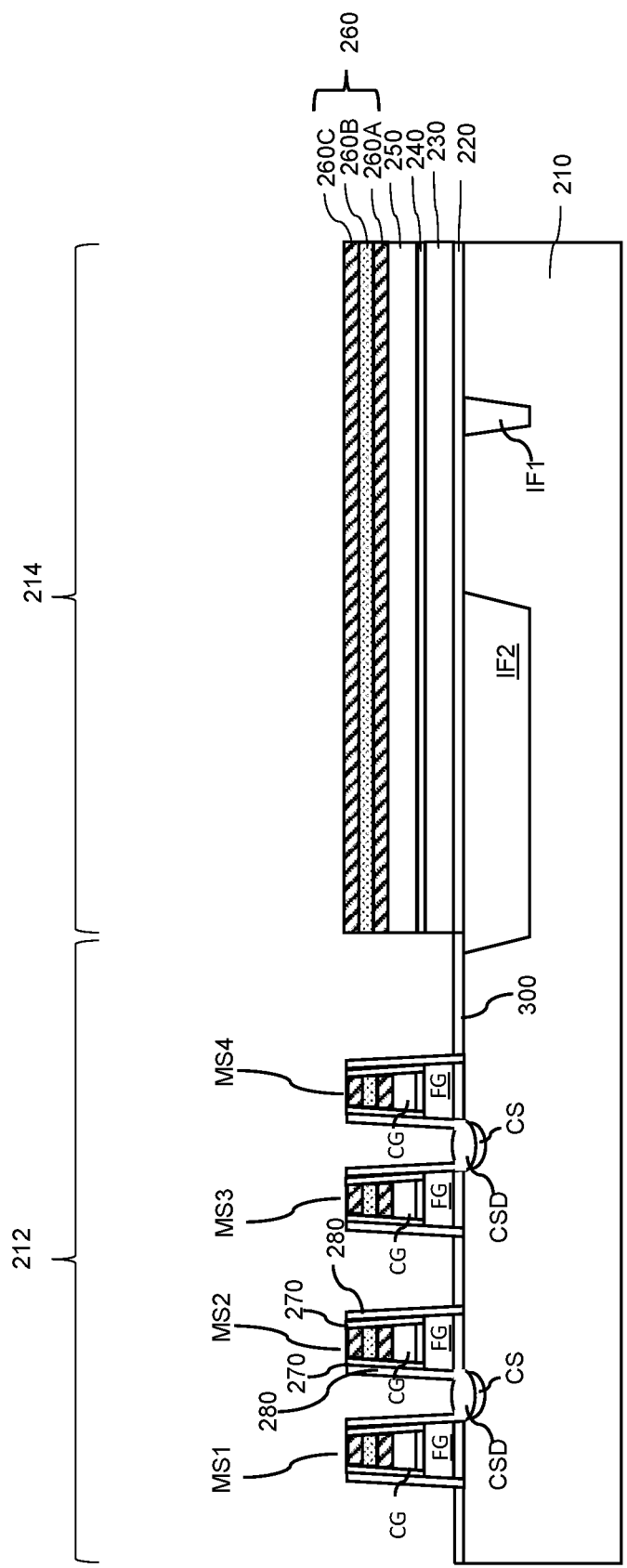
FIG. 10 is a vertical cross-sectional view illustrating a step of forming select gate dielectric layer in a method for fabricating a semiconductor device in accordance with some embodiments.

Referring to FIG. 10, select gate dielectric layers 300 may be formed adjacent to the memory stacks MS1-MS4 as well as in between the memory stacks MS1-MS4. The select gate dielectric layer 300 may be an oxide layer or other suitable dielectric layers. For example, the select gate dielectric layer 300 may include silicon oxide, silicon nitride, silicon oxynitride, other non-conductive materials, or the combinations thereof. A thickness of the select gate dielectric layers 300 may be in a range of about 5 angstroms to about 500 angstroms in order to provide suitable electrical isolation between the substrate 210 and select gates to be subsequently formed. In some embodiments, a thermal oxidation process may be performed, such that portions of the substrate 210 not covered by the memory stacks MS1-MS4, and the common source dielectric layer CSD may be oxidized to form the select gate dielectric layers 300 (i.e. surfaces of the substrate 210 located between pairs of memory stacks MS1, MS2 and MS3, MS4. The select gate dielectric layer 300 may be deposited by any suitable method, such as by CVD, plasma-enhanced chemical vapor deposition (PECVD), LPCVD, or other suitable processes.

Figure 11:
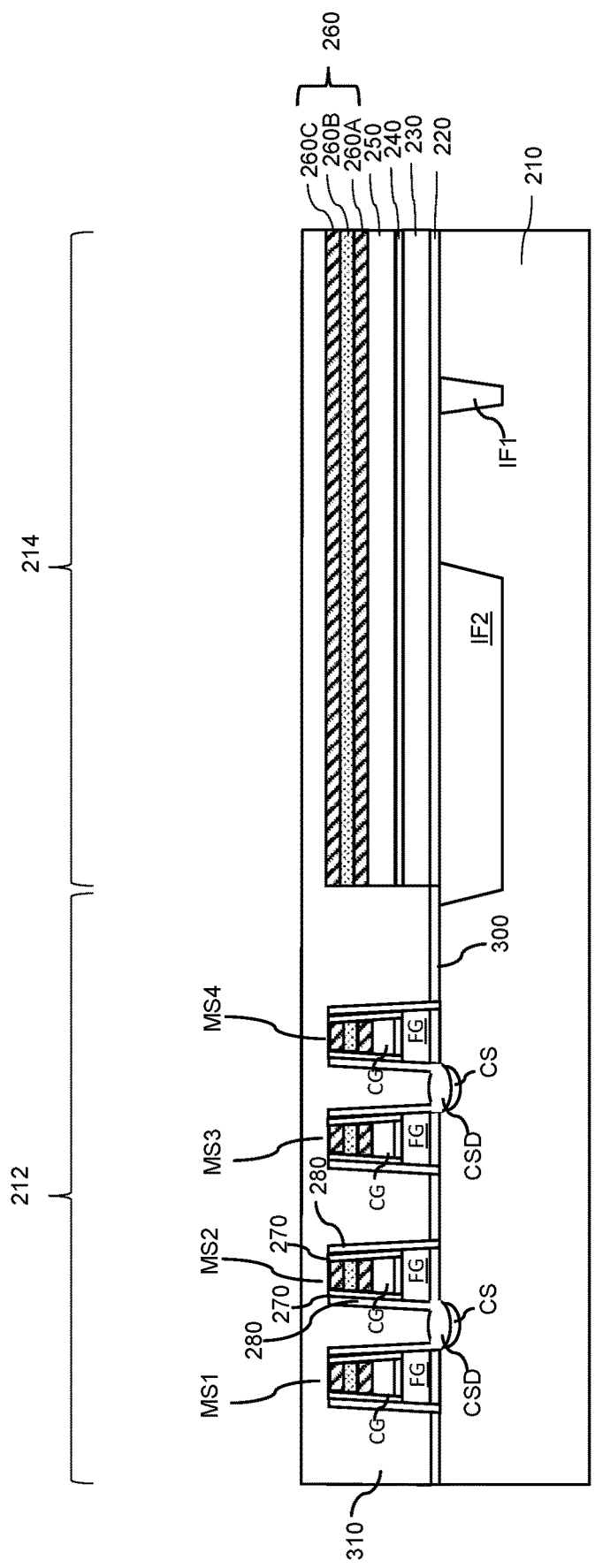
FIG. 11 is a vertical cross-sectional view illustrating a step of forming conductive layer in a method for fabricating a semiconductor device in accordance with some embodiments.

Referring to FIG. 11, a conductive layer 310 may be formed over the entire substrate 210 and on the structure of FIG. 11. In some embodiments, the conductive layer 310 may be made of polysilicon, other suitable conductive materials, or combinations thereof. For example, the conductive layer 310 may include doped polysilicon or doped amorphous silicon. The conductive layer 310 may be formed by CVD, plasma-enhanced chemical vapor deposition (PECVD), LPCVD, or other suitable processes.

Figure 12:
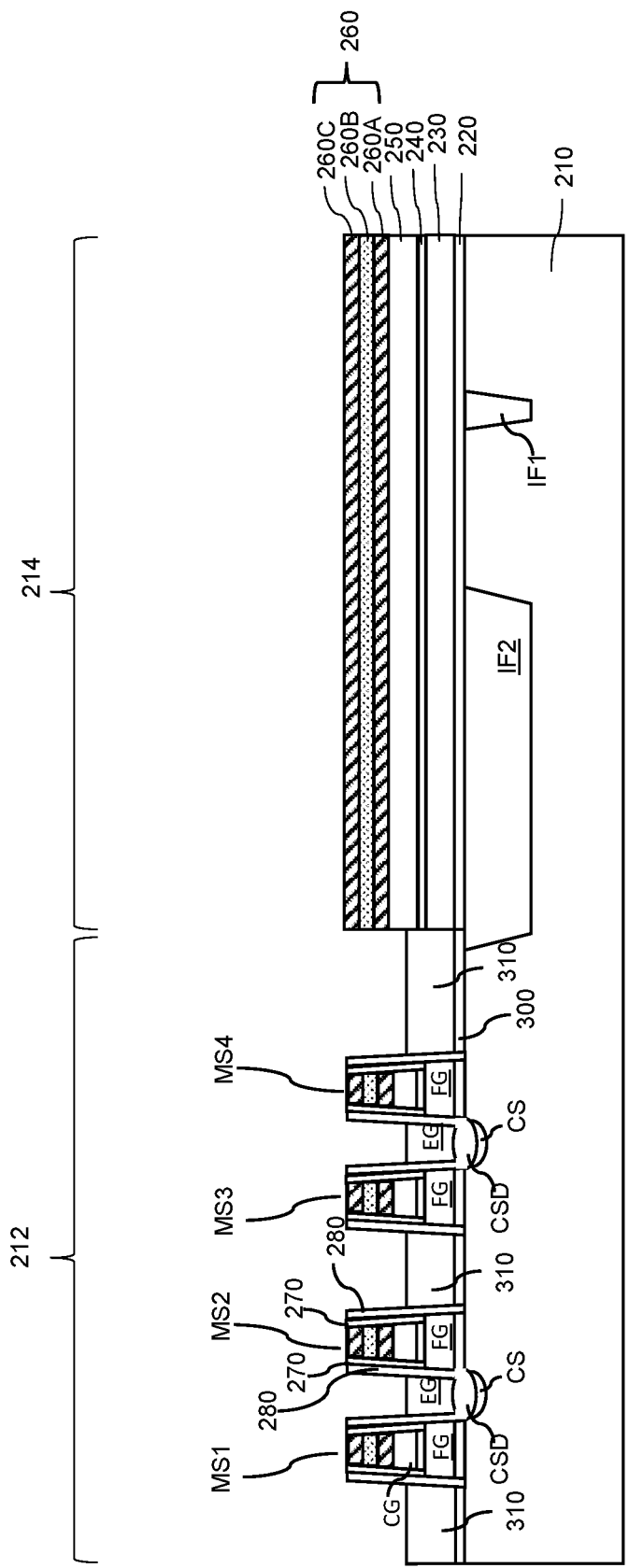
FIG. 12 is a vertical cross-sectional view illustrating a step of patterning conductive layer to form the erase gates in a method for fabricating a semiconductor device in accordance with some embodiments.

Referring to FIG. 12, the conductive layer 310 may be etched to remove excess conductive material of the conductive layer 310 from the region between pairs of memory stacks, e.g. MS1, MS2 and MS3, MS4 as well as adjacent to the memory stacks MS1-MS4, to form an erase gate EG between the memory stacks MS1 and MS2 as well as between the memory stacks MS3 and MS4 over the common source region CS. In addition, material from the etched conductive layer 310 between pairs of memory stacks MS1, MS2 and MS3, MS4 may be patterned as discussed below to form select gates SG on the sides of the memory stacks MS1-MS4 opposite of the erase gates EG.

Figure 13:
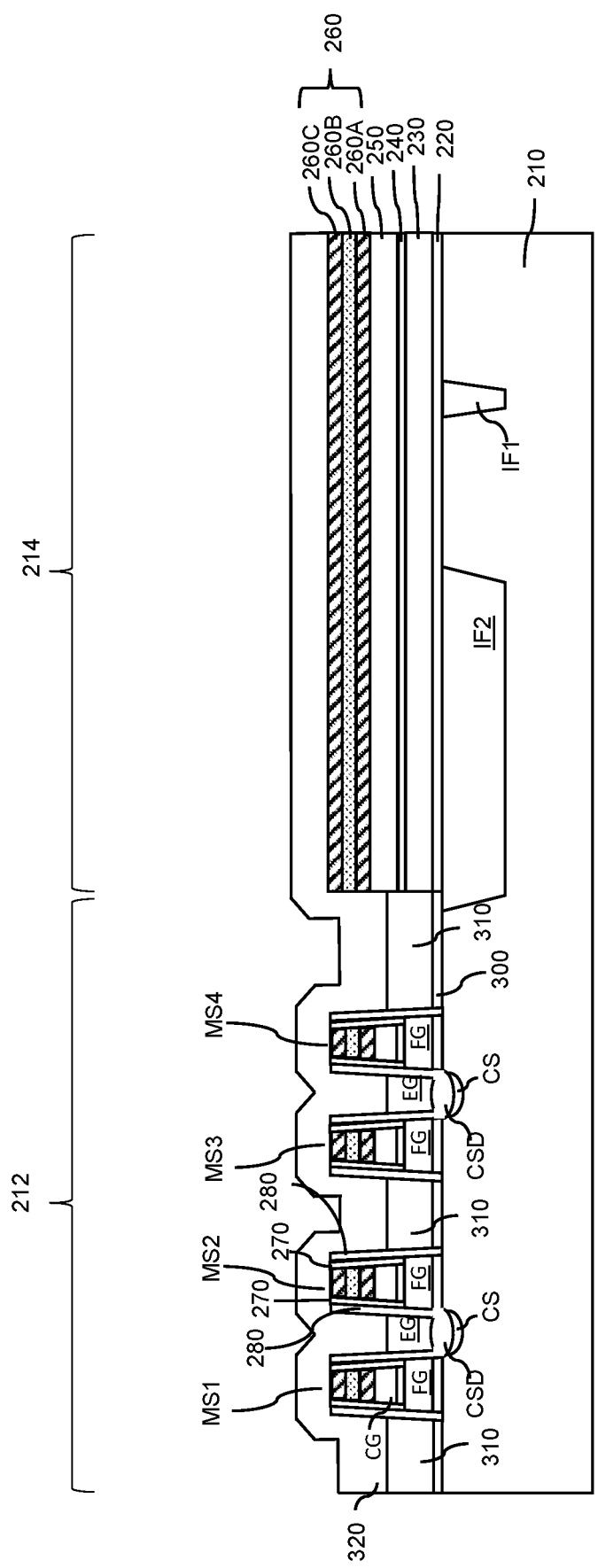
FIG. 13 is a vertical cross-sectional view illustrating a step of deposit hard mask in a method for fabricating a semiconductor device in accordance with some embodiments.

Referring to FIG. 13, a hard mask layer 320 may be conformally deposited over the etched conductive layer 310 and memory stacks MS1-MS4. The hard mask layer 320 protects the erase gate EG during subsequent etching steps. The hard mask layer 320 may also be used in pattering the select gates SG as discussed in more detail below. In addition, the hard mask layer 320 may be patterned to form contact etch stops 320e in subsequent operations. As discussed in more detail below the contact etch stops 320e may permit for the narrowing of the drain/source contact 400, which ultimately allows for an increased density of memory cells on the device. The hard mask layer may be formed by any suitable method such as CVD, plasma-enhanced chemical vapor deposition (PECVD) or LPCVD.

Figure 14:
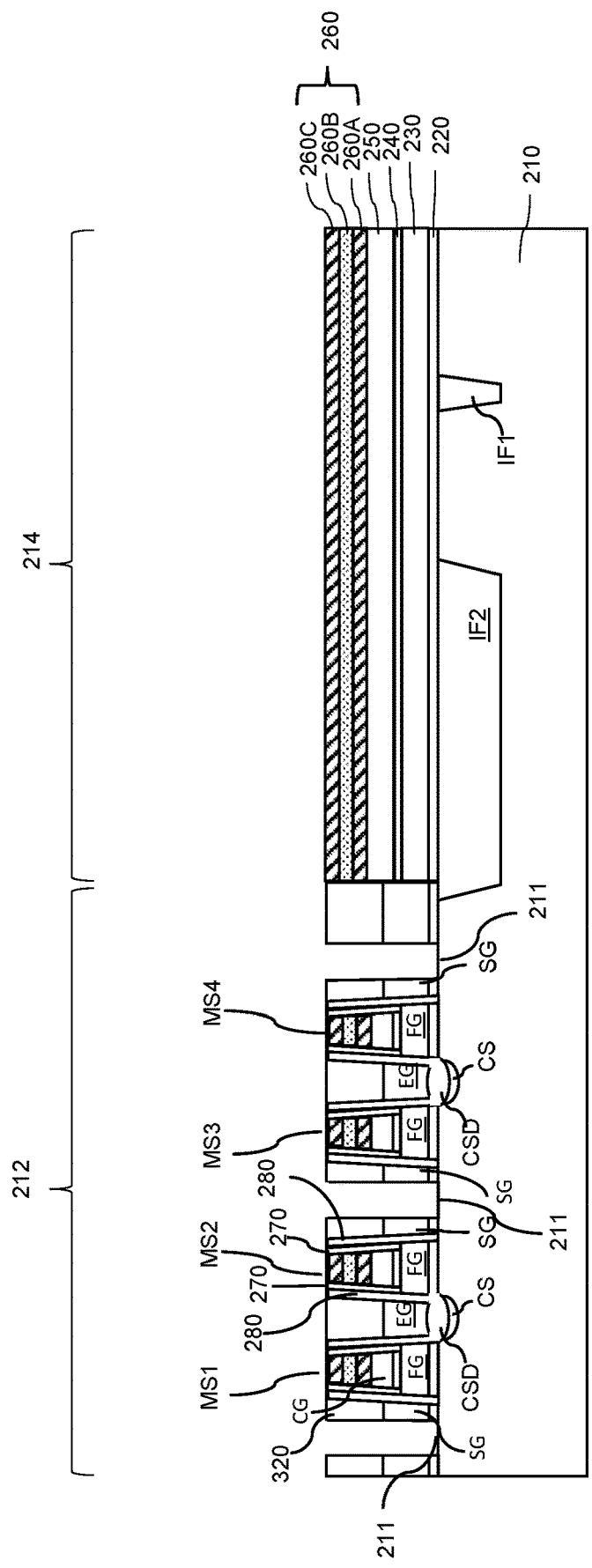
FIG. 14 is a vertical cross-sectional view illustrating a step of form select gates in a method for fabricating a semiconductor device in accordance with some embodiments.

Referring to FIG. 14, a chemical mechanical polishing (CMP) process may be performed to remove excess portions of the hard mask layer 320 over the memory stacks MS1-MS4. For example, the hard mask layer 320 may be polished down to the top level of the hard mask layer 260 over the memory stacks MS1-MS4. A photoresist (not shown) may be deposited on the top surface of the memory stacks MS1-MS4 and patterned such, e.g. 20-40 nm wide trenches 211 between pairs of memory stacks MS1, MS2 and MS3, MS4 may be formed in the underlying conductive layer 310 and hard mask layer 320. In an embodiment, etching may continue until the top surface of the substrate 210 is reached. In this manner, the hard mask layer 320, conductive layer 310 and select gate dielectric layer 300 may be removed down to the top surface of the substrate 210, thereby forming a trench located between adjacent pairs of memory stacks M2, M3. Further, in this manner, select gates SG may be formed along the inter-gate dielectric layers 280 on the sides of the memory stacks MS1-MS4 on opposite sides of the erase gates EG.

Figure 15:
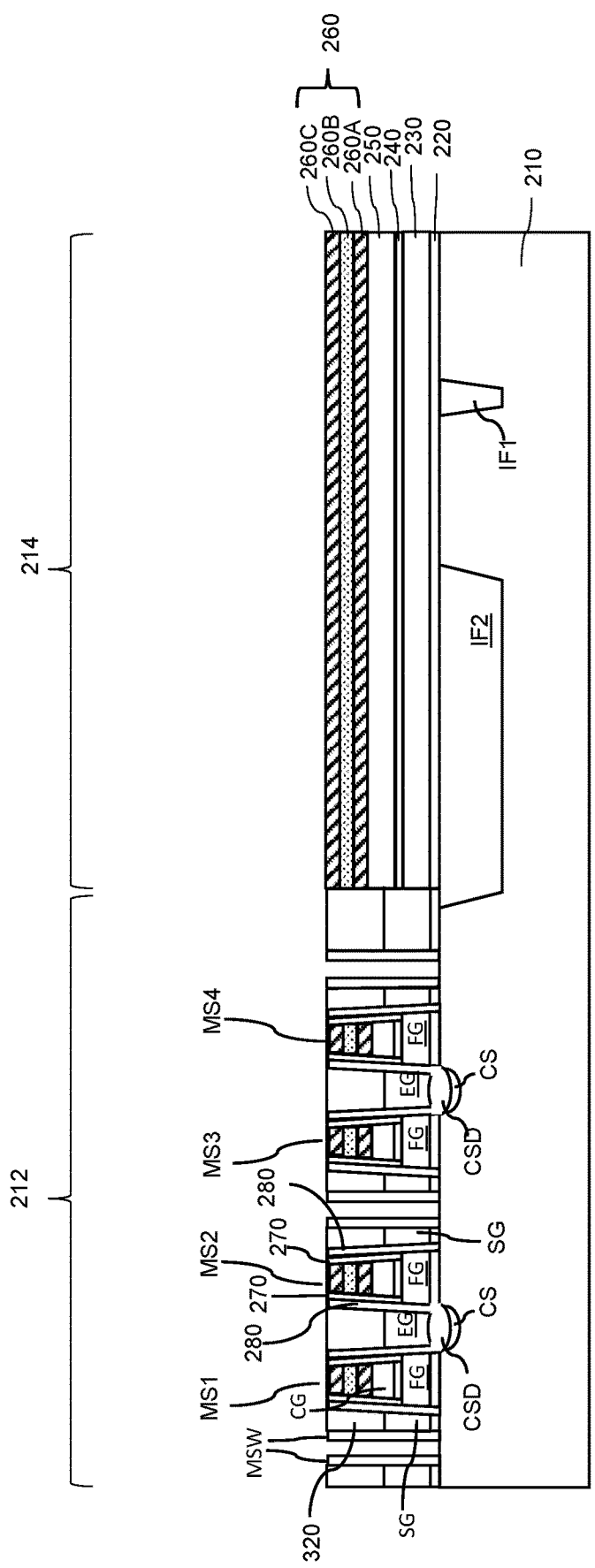
FIG. 15 is a vertical cross-sectional view illustrating a step of forming main sidewall spacers in a method for fabricating a semiconductor device in accordance with some embodiments.

Referring to FIG. 15, main sidewall spacers MSW may be formed on the sidewalls of the select gates SG and the remaining portions of the hard mask layer 320 located over the select gates SG. In an embodiment, the main sidewall spacers MSW comprise silicon nitride. However, other suitable materials are within the contemplated scope of disclosure. In embodiment, the main sidewall spacers MSW comprise silicon nitride and may be formed by any suitable method, such as CVD, plasma-enhanced chemical vapor deposition (PECVD) or LPCVD.

Figure 16:
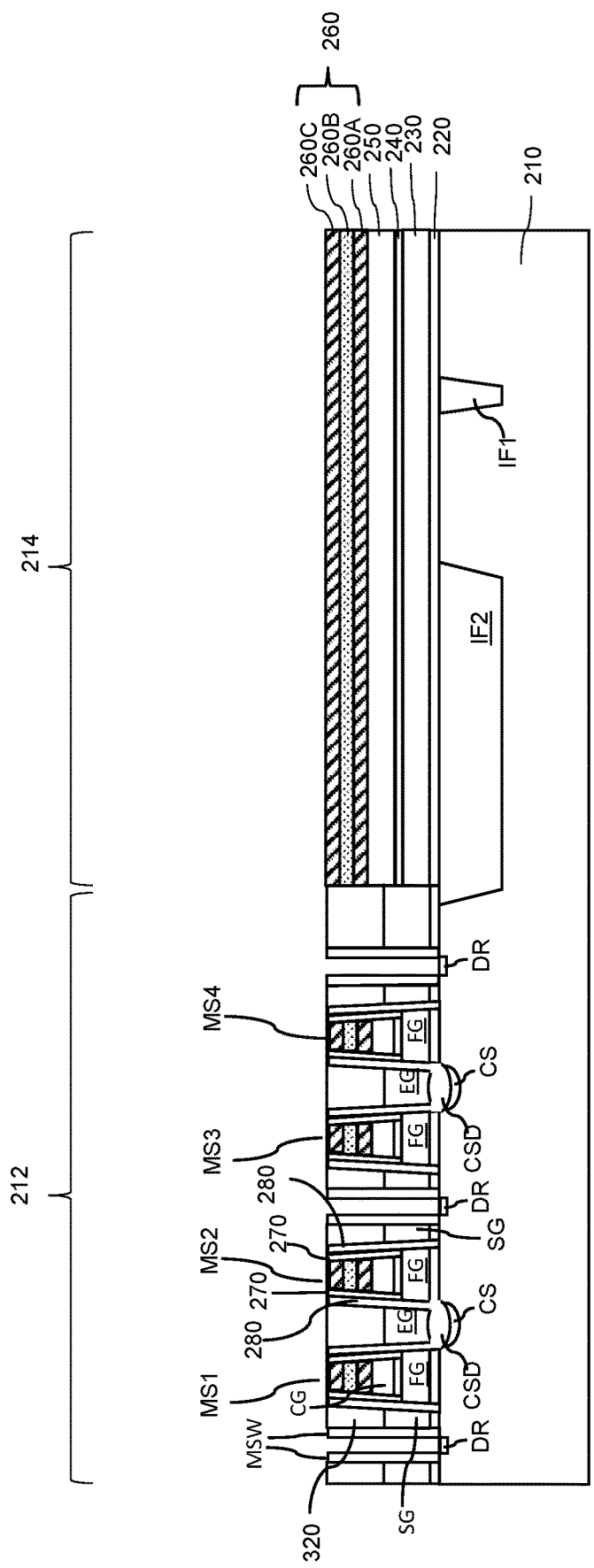
FIG. 16 is a vertical cross-sectional view illustrating a step of forming drain regions in a method for fabricating a semiconductor device in accordance with some embodiments.

Referring FIG. 16, drain regions DR may be formed in the exposed portions of the substrate 210 between the main sidewall spacers MSW. The drain regions DR may be formed by a self-aligning ion implantation process or by depositing a thin layer of metal, such as Ti, Ni, W and heating to react the metal with the substrate to form a metal silicide. The formation of the drain regions DR define the outer boundaries of the split gate memory cells SGMC1, SGMC2.

Figure 17:
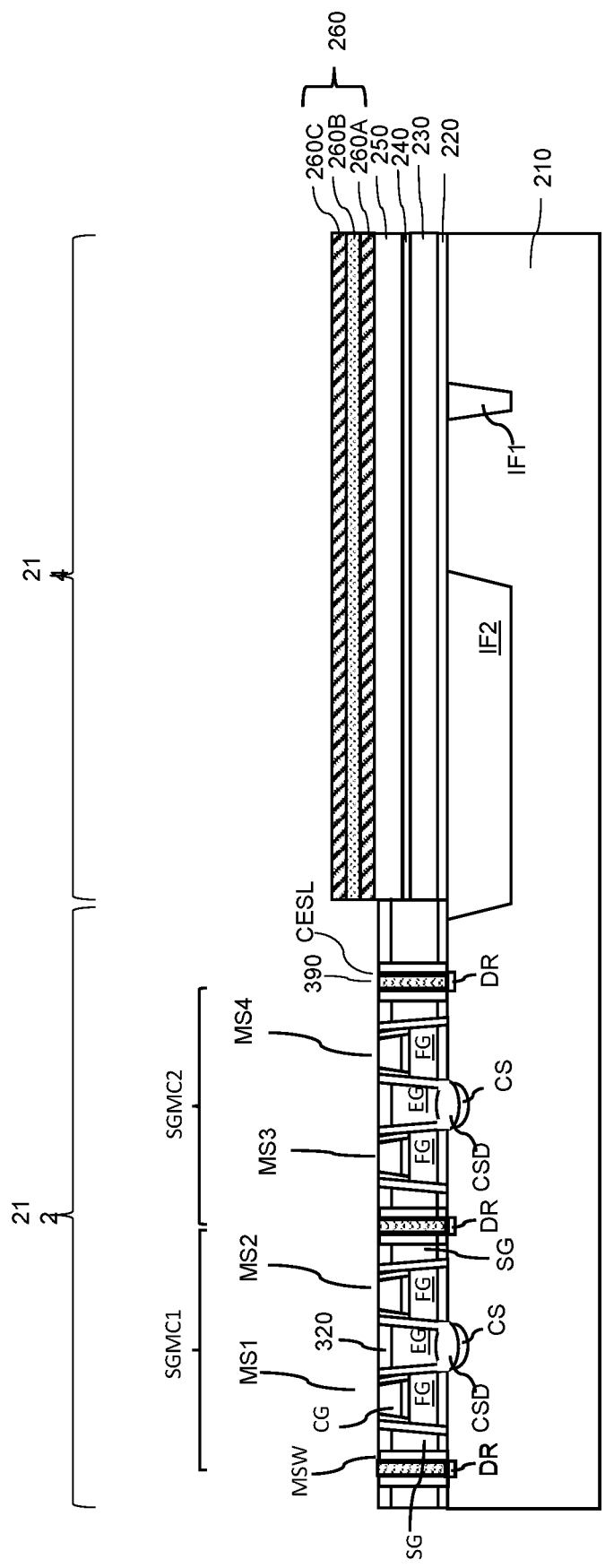
FIG. 17 is a vertical cross-sectional view illustrating a step of forming contract etch stop layer and deposit and pattern oxide layer over the memory region in a method for fabricating a semiconductor device in accordance with some embodiments.

Referring to FIG. 17, after forming the self-aligned drain regions DR, a contact etch stop layer CESl, may be conformally deposited on the sidewalls of the main sidewall spacers MSW. The contact etch stop layer CESL may have a thickness in the range of 35-75 Å. In an embodiment, a dielectric layer 390 may be formed to fill any open gap between adjacent pairs of memory stacks M1-M4. That is, the dielectric material may be deposited on the contact etch stop layer CESL. In an embodiment, a CMP process may be performed to remove patterned hard mask layer 260 located within each memory stack M1-M4 and to reduce the thickness of the hard mask layer 320 formed adjacent to the memory stacks M1-M4. In an embodiment, the CMP process may be performed such that the resulting hard mask layer 320 over the select gates SG may be in the range of 250-400 Å.

Figure 18:
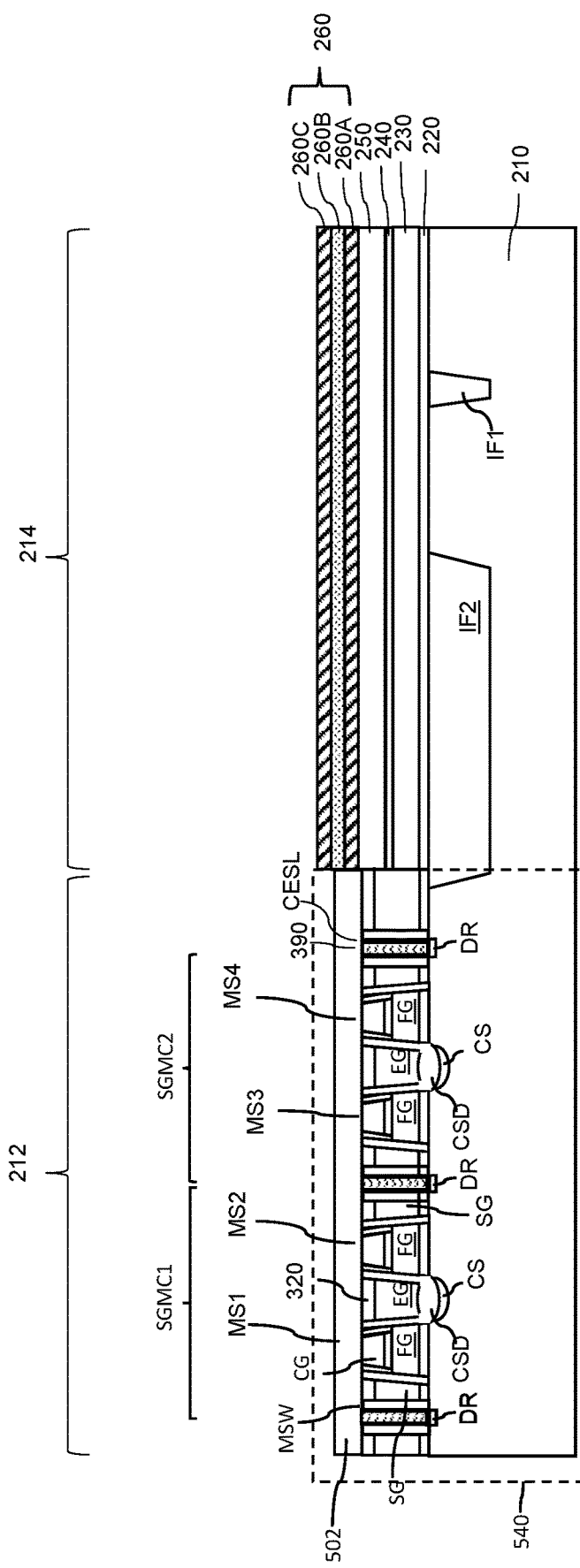
FIG. 18 is a vertical cross-sectional view illustrating a step of depositing an oxide hard mask over the memory region in a method for fabricating a semiconductor device in accordance with some embodiments.

Referring to FIG. 18, an oxide hard mask layer 502 may be deposited over the memory region 212 of the substrate 210. The oxide hard mask layer 502 may be made of any suitable oxide, such as silicon oxide.

Figure 19:
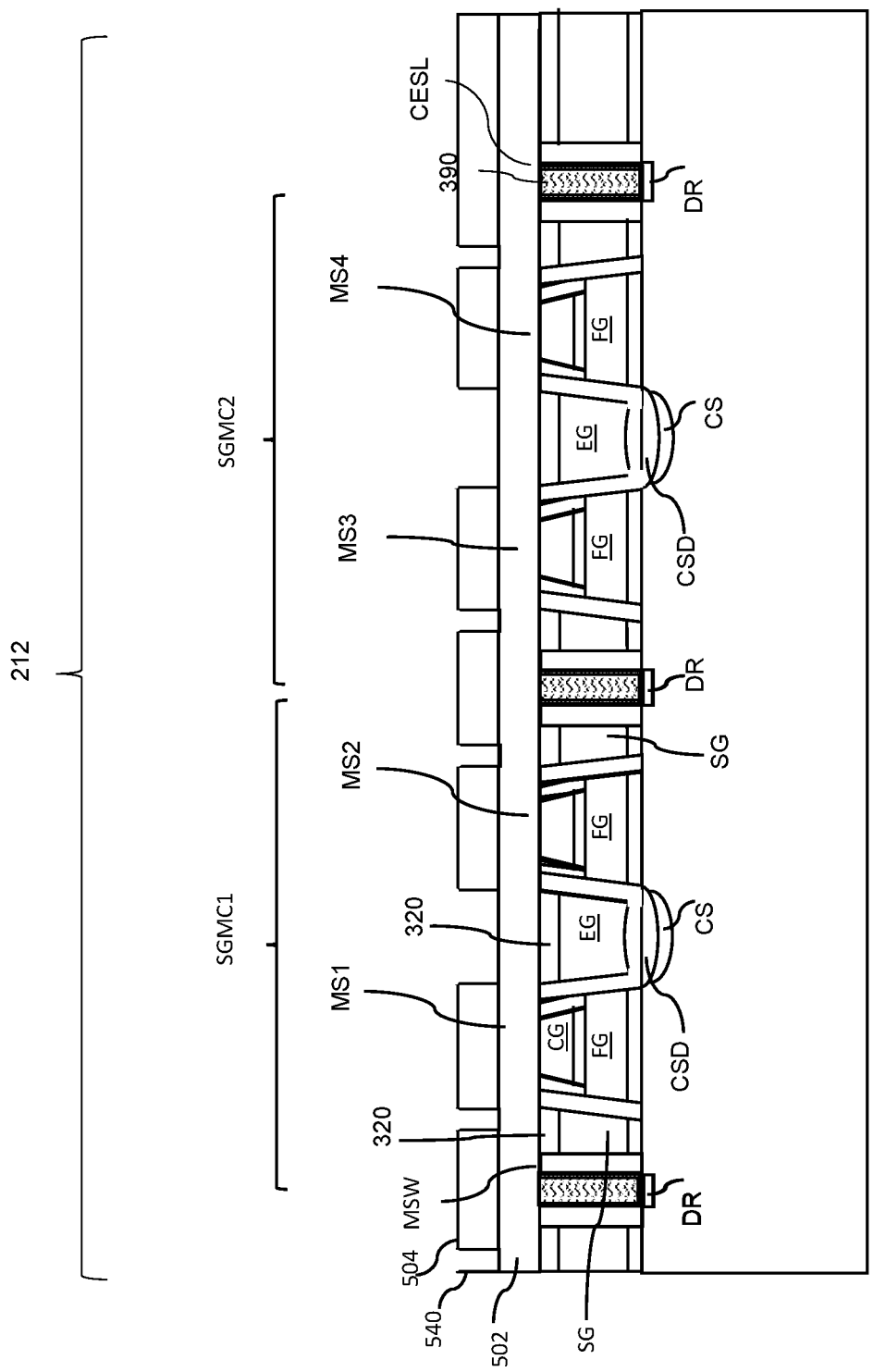
FIG. 19 is a close-up of the memory region of the vertical cross-sectional view of FIG. 18 illustrating a step of depositing and patterning a photoresist in a method for fabricating a semiconductor device in accordance with some embodiments.

Referring to FIG. 19, a close up 540 of the memory region 212 is illustrated with the deposition of a photoresist layer 504 over the oxide hard mask layer 502. The photoresist layer 504 may be patterned to expose select portions of the oxide hard mask layer 502.

Figure 20:
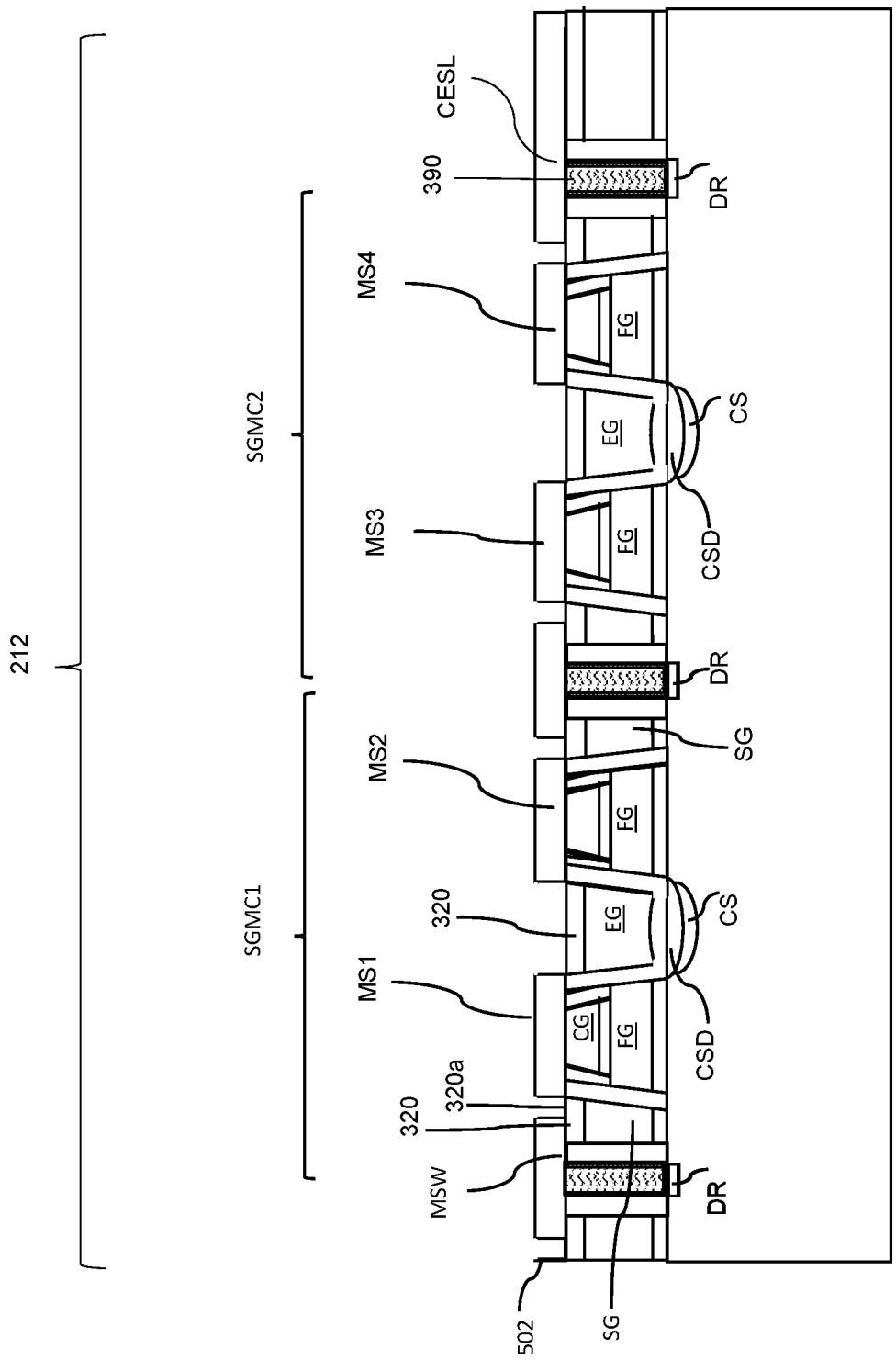
FIG. 20 is a close-up of the memory region of the vertical cross-sectional view of FIG. 18 illustrating a step of patterning the oxide hard mask layer using the patterned photoresist illustrated in FIG. 19 in a method for fabricating a semiconductor device in accordance with some embodiments.

Referring to FIG. 20, the oxide hard mask layer 502 may be patterned using the patterned photoresist layer 504 such that the oxide hard mask layer 502 has the same pattern as the patterned photoresist layer 504. As can be seen in FIG. 20, after patterning the oxide hard mask layer 502, first portions 320a of the hard mask layer 320 above the select gates SG may be exposed while second portions of the hard mask layer 320 remain covered by the patterned oxide hard mask layer 502. In an embodiment, the patterning of the patterned oxide hard mask layer 502 may be such that the hard mask layer 320 over the erase gate EG is fully exposed.

Figure 21:
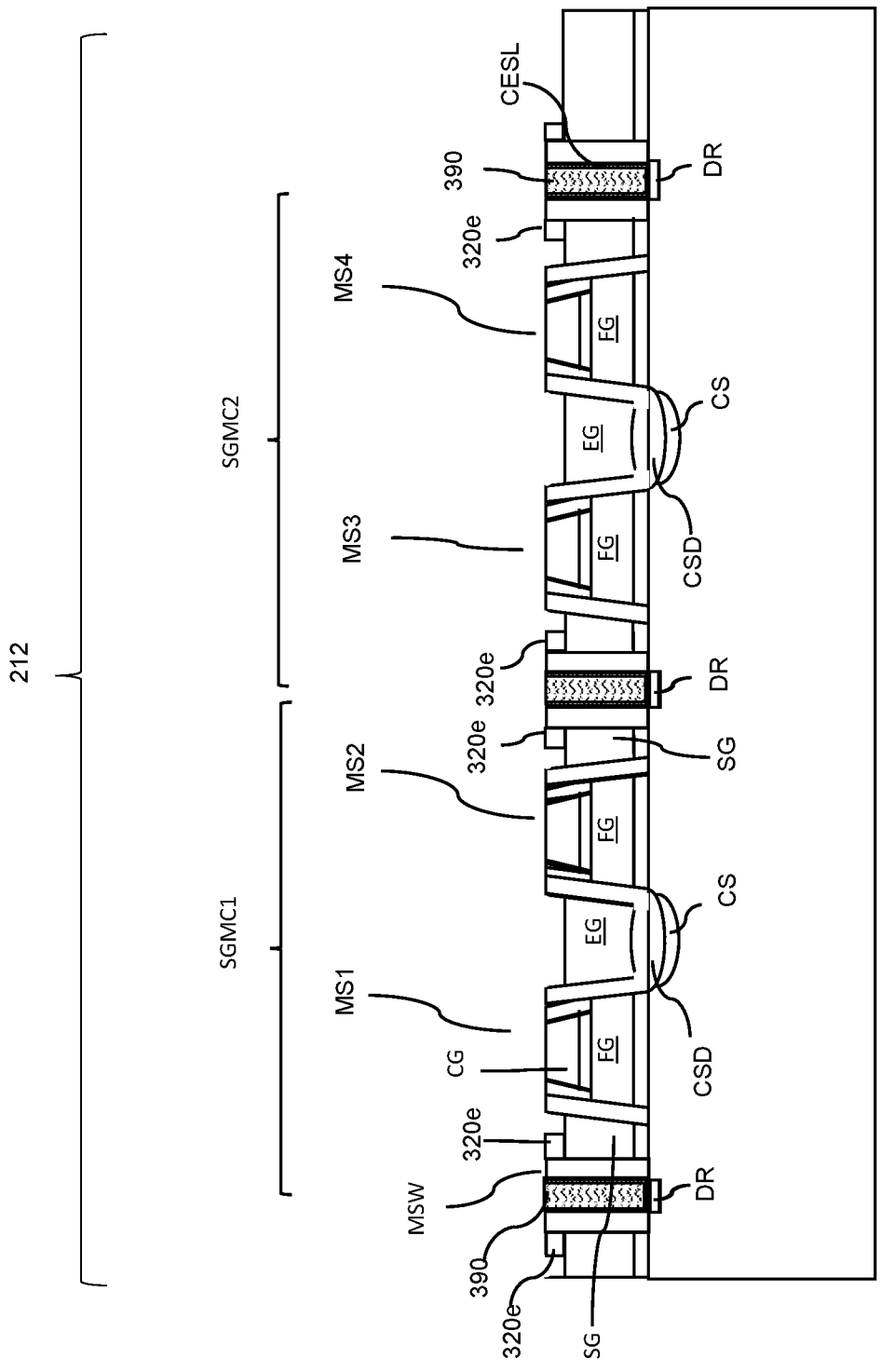
FIG. 21 is a vertical cross-sectional view illustrating a step of patterning the hard mask layer with the patterned oxide hard mask layer.

Referring to FIG. 21, the patterned oxide hard mask layer 502 may be used as a mask to pattern the hard mask layer 320, i.e. remove the exposed first portions 320a of the hard mask layer 320 to form the contact etch stops 320e. Then, the patterned oxide hard mask layer 502 may be removed. Removal of the oxide hard mask layer 502 may be accomplished, for example, with a CMP process. In an embodiment, a portion of the hard mask layer 320 adjacent the main side wall MSW (i.e., contact etch stops 320e) is not removed. In an embodiment, a layer of metal, such as Co, Ni, Ti, Ta, W or alloys thereof, may be deposited over the exposed surface of the polysilicon erase gates EG and select gates SG. The wafer may then be annealed at a temperature in the range of 750-1000° C. for 1-2 hours or laser annealed for microseconds to seconds, depending on the power of the laser, to form silicide contact regions 396 on top of the erase gates EG and select gates SG. In addition, the oxide hard mask layer 502 may be removed, for example, with a CMP process.

Figure 22:
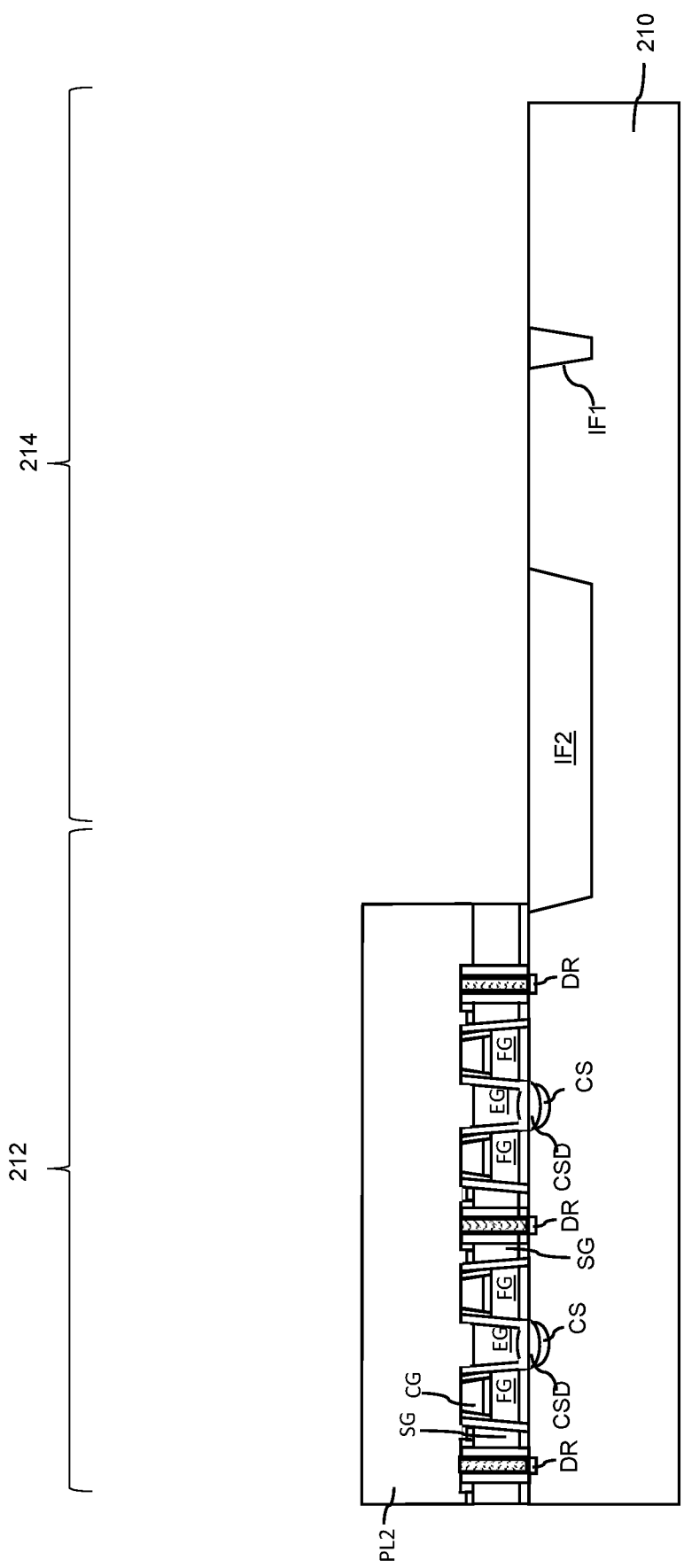
FIG. 22 is a vertical cross-sectional view illustrating a step of depositing protective layer over memory region and of Remove tunnel dielectric layer, floating gate layer, blocking dielectric layer, control gate layer, and hard mask layer from peripheral region in a method for fabricating a semiconductor device in accordance with some embodiments.

Referring to FIG. 22, a protective layer PL2 may be deposited within the memory region 212. The protective layer PL2 may protect the memory region 212 of the substrate 210 while logic devices may be subsequently formed in the peripheral region 214 of the substrate as discussed in more detail below. Also illustrated in FIG. 18, the tunneling layer 220, the floating gate layer 230, the blocking layer 240, the control gate layer 250 and the hard mask layer 260 may be removed from the substrate 210 while the second protective layer PL2 protects the memory region 212 of the substrate 210. The tunneling layer 220, the floating gate layer 230, the blocking layer 240, the control gate layer 250 and the hard mask layer 260 may be removed in a series of etching steps, such as by a series of wet etching steps.

Figure 23:
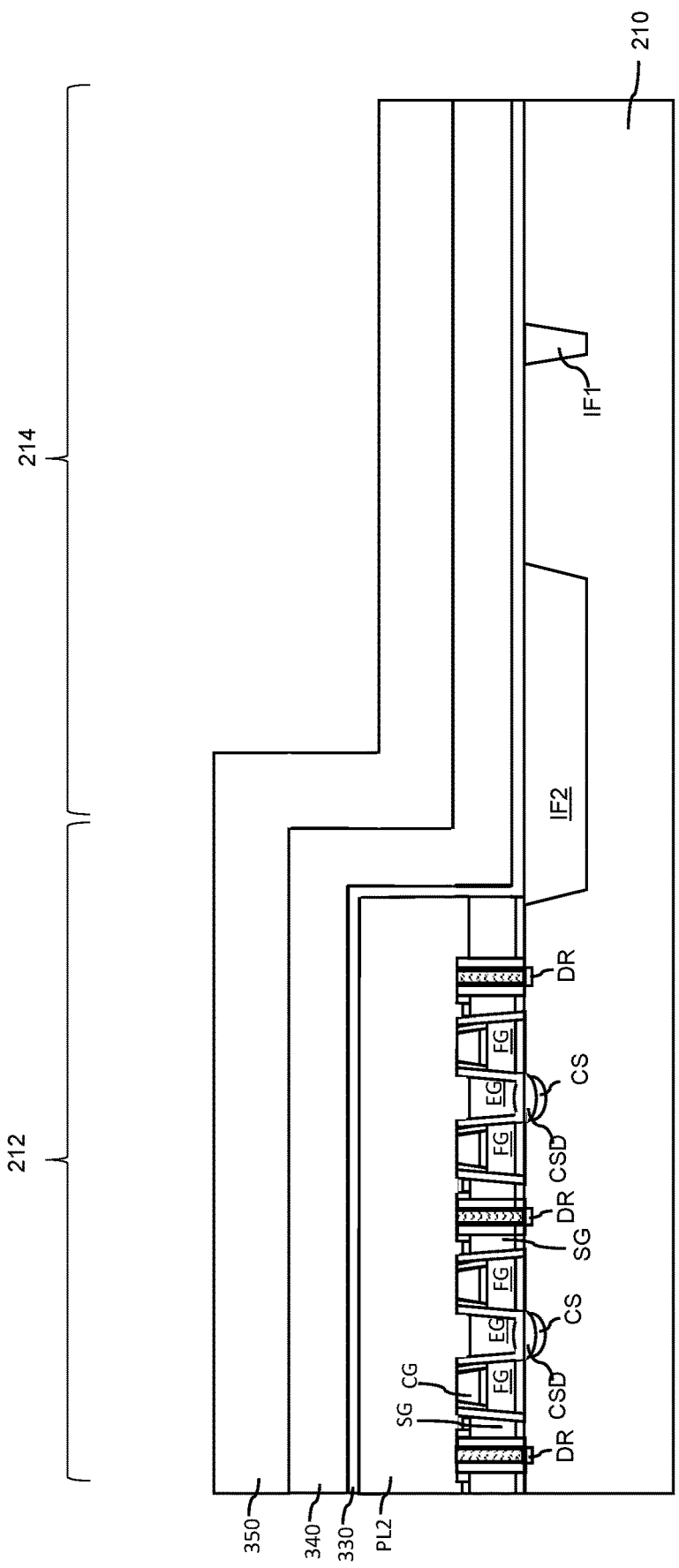
FIG. 23 is a vertical cross-sectional view illustrating a step of forming gate dielectric layer, gate electrode layer, and hard mask layer in a method for fabricating a semiconductor device in accordance with some embodiments.

Referring to FIG. 23, a gate dielectric layer 330, a gate electrode layer 340, and a hard mask layer 350 may be conformally deposited over the memory region 212 and peripheral region 214. Herein, one or more processes (e.g., one or more lithography and etching processes) may be initially performed to remove any protruding portions of the isolation features IF1 and IF2, such that a planar surface is yielded in the peripheral region 214. Subsequently, the gate dielectric layer 330, the gate electrode layer 340, and the hard mask layer 350 may be formed in sequence over the substrate 210. The gate dielectric layer 330 may be made of suitable high-k materials, other non-conductive materials, or combinations thereof. Examples of the high-k material include, but are not limited to, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$), or other applicable dielectric materials. The gate electrode layer 340 may be made of conductive materials, such as a polysilicon layer. The hard mask layer 350 may be made of silicon nitride or other suitable materials. Optionally, a planarization process may be performed to the surface of the substrate 210 prior to forming the gate dielectric layer 330, a gate electrode layer 340, and a hard mask layer 350.

In some embodiments, the gate dielectric layer 330 may be thicker in a region where high voltage devices may be formed, and thinner in a region where low voltage devices may be formed. Therefore, the select gate dielectric layer 300 may have a thick region and a thin region that is thinner than the thick region. Therefore, the gate dielectric layer 330 may have a thick region and a thin region thinner than the thick region. Exemplary methods for achieving the difference thicknesses may include conformally depositing a gate dielectric layer 330, masking a first region of the gate dielectric layer 330 while unmasking a second region of the gate dielectric layer, and thinning (e.g., etching) the second region of the gate dielectric layer 330. The resulting second region is thus thinner than the first region.

Figure 24:
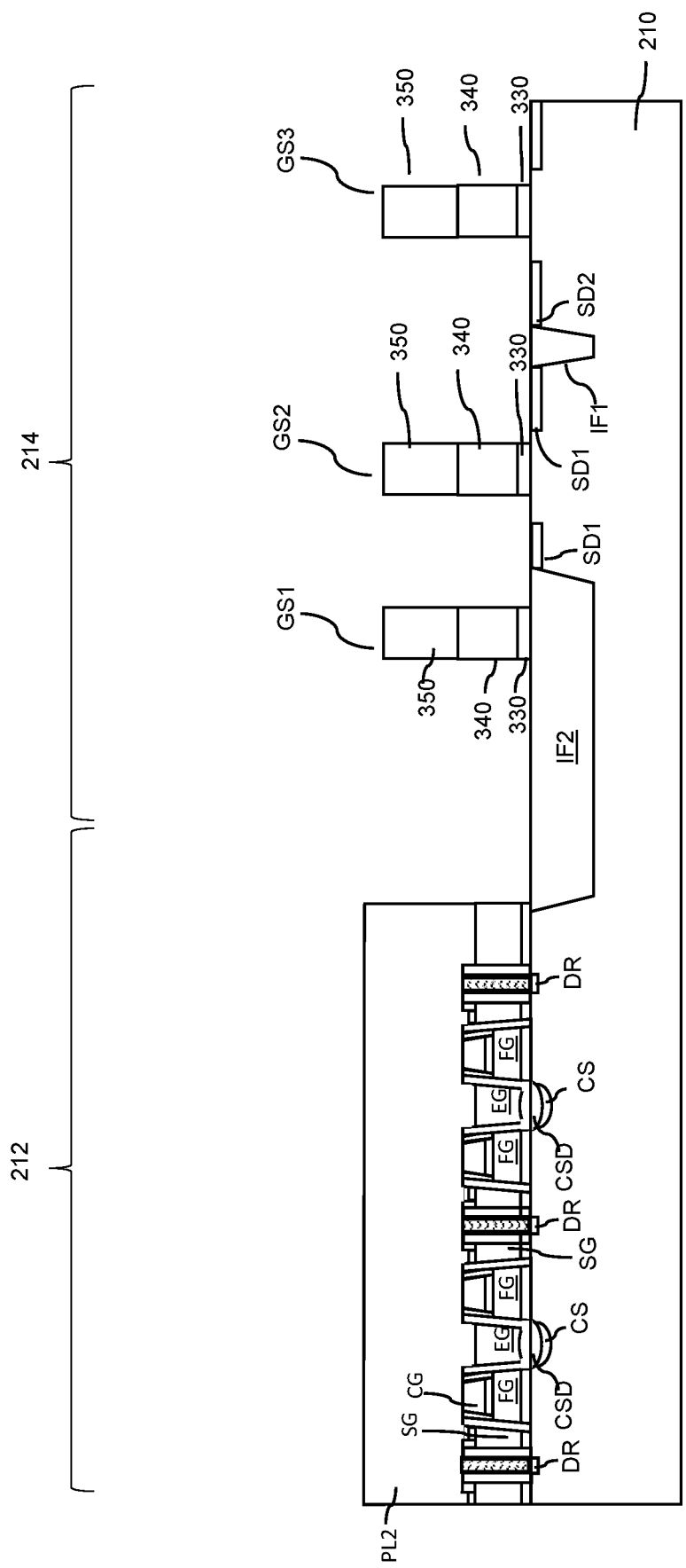
FIG. 24 is a vertical cross-sectional view illustrating a step of patterning gate electrode in a method for fabricating a semiconductor device in accordance with some embodiments.

Referring to FIG. 24, the gate dielectric layer 330, the gate electrode layer 340 and the hard mask layer 350 may be patterned to form gate stacks GS1, GS2 and GS3. In an embodiment, gate stack GS1 may be a dummy gate stack located over the exposed first isolation feature IF1. The second gate stack GS2 may be a high voltage memory stack. The third gate stack GS3 may be a logic memory stack formed over the peripheral region 214. Patterning may be performed by any suitable lithography and etching processes.

Figure 25:
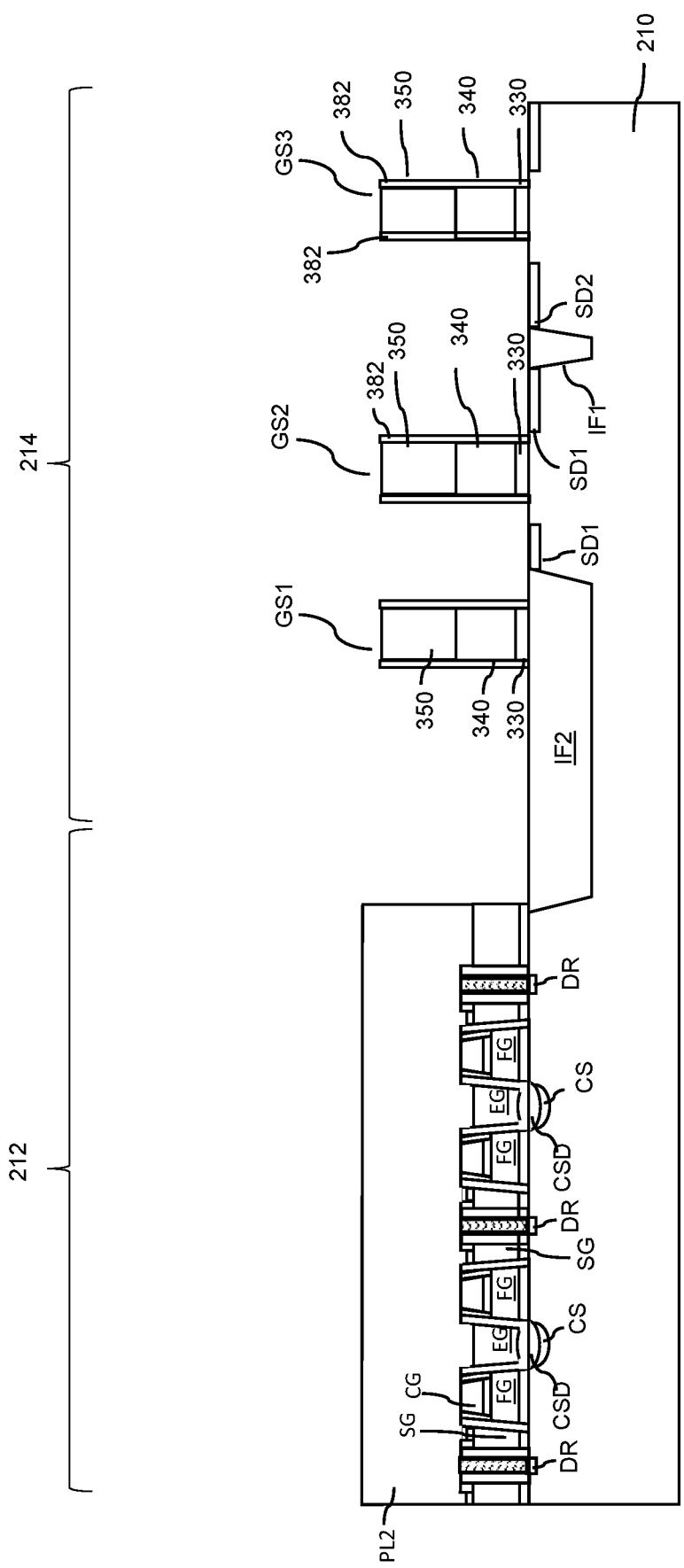
FIG. 25 is a vertical cross-sectional view illustrating a step of forming seal layers on gate stacks in a method for fabricating a semiconductor device in accordance with some embodiments.

Referring to FIG. 25, seal layers 382 may be formed on opposite sidewalls of the dummy memory stack GS1, the high voltage memory stack GS2, and the logic memory stack GS3. For example, a dielectric seal layer may be conformally formed over the structure in the peripheral region 214 of FIG. 21, and an etching process (e.g. anisotropic etching process) may be performed to remove horizontal portions of the dielectric seal layer. Vertical portions of the dielectric spacer layer remain to form the seal layers 382. The seal layers 382 may be made of silicon nitride or other suitable materials. Other suitable materials are within the contemplated scope of disclosure.

Figure 26:
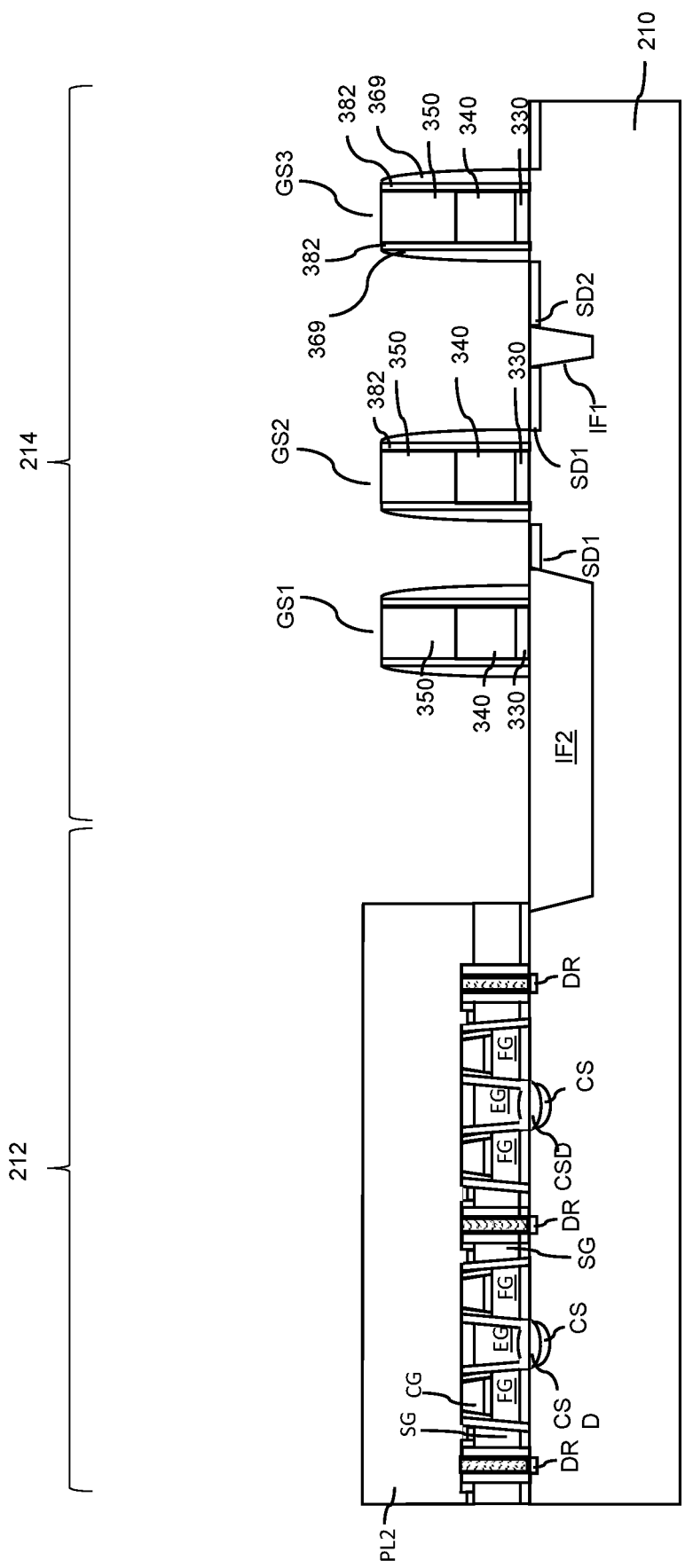
FIG. 26 is a vertical cross-sectional view illustrating a step of forming spacers in a method for fabricating a semiconductor device in accordance with some embodiments.

Referring to FIG. 26, sidewall spacers 369 may be formed over the seal layers 382 over the sidewalls of the gate stacks GS1-GS3. The sidewall spacers 369 may be formed from a dielectric material, such as silicon nitride, silicon oxide, and/or other dielectric materials, or the combinations thereof. Sidewall spacers 369 may be made by any suitable method, such as CVD, plasma-enhanced chemical vapor deposition (PECVD) or LPCVD. For example, a dielectric spacer layer may be conformally formed over the structure of FIG. 22, and an etching process (e.g. anisotropic etching process) is performed to remove horizontal portions of the dielectric spacer layer, and vertical portions of the dielectric spacer layer remain to form the sidewall spacers 369.

Figure 27:
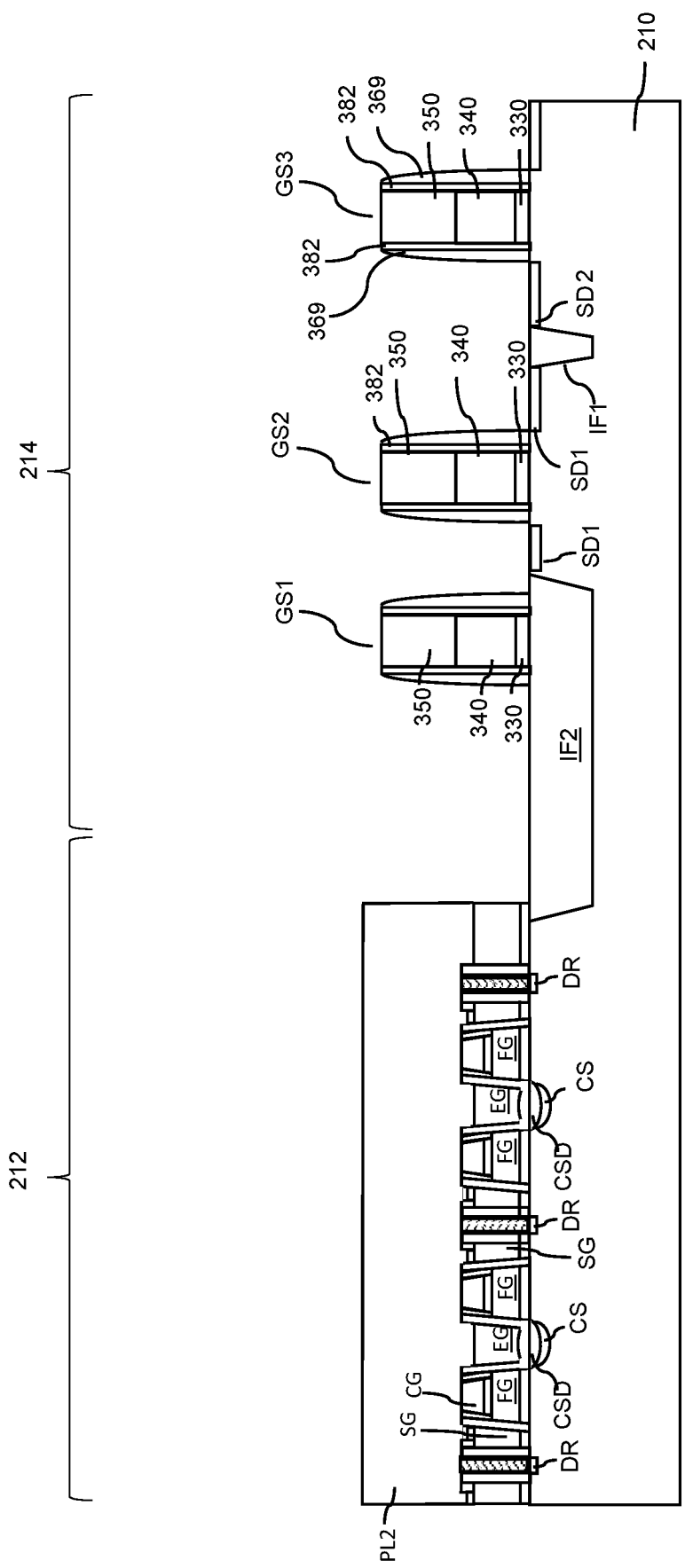
FIG. 27 is a vertical cross-sectional view illustrating a step of forming source/drain regions in a method for fabricating a semiconductor device in accordance with some embodiments.

Referring to FIG. 27, source/drain regions SD1 and SD2 may be formed in the peripheral region 214 of the substrate 210. The source/drain regions SD1 and SD2 may be made by ion implantation process or by forming a silicide with exposed portions of the substrate 210.

Figure 28:
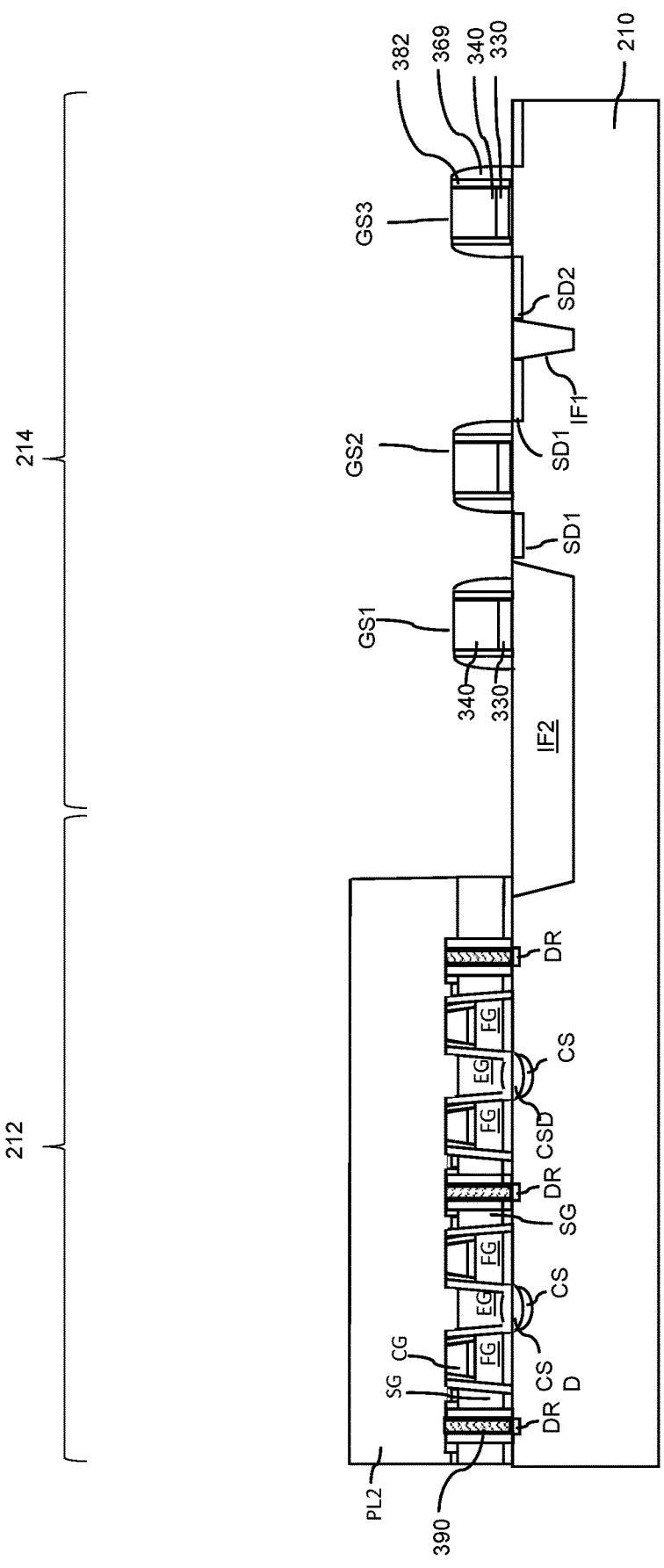
FIG. 28 is a vertical cross-sectional view illustrating a step of planarizing a peripheral region of substrate in a method for fabricating a semiconductor device in accordance with some embodiments.

Referring to FIG. 28, a planarization process, for example CMP, may be optionally performed to remove the hard mask layer 350. The optional planarization process may expose the top surfaces of the gate stacks GS1-GS3.

Figure 29:
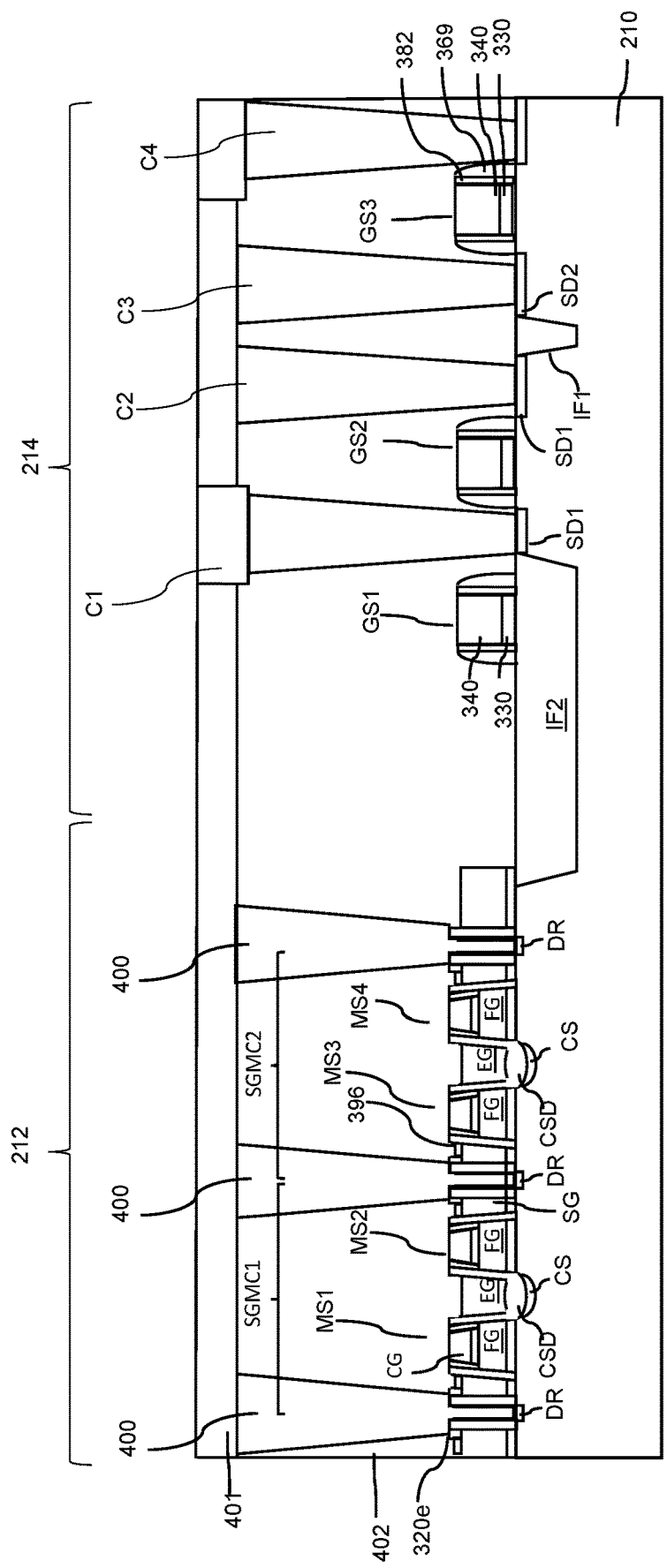
FIG. 29 is a vertical cross-sectional view illustrating a step of forming contacts in a method for fabricating a semiconductor device in accordance with some embodiments.

Referring to FIG. 29, the second protective layer PL2 may be removed from the memory region 212 of the substrate 210 and interlevel dielectric layers 401, 402 may be formed over the entire surface of the substrate 210. Drain/source contact 400 may be formed in the memory region 212 of the substrate 210 and source/drain contacts C1-C4 formed in the peripheral portion of the substrate 210. Drain/source contact 400 and source/drain contacts C1-C4 may be made by anisotropically etching vias in the interlevel dielectric layers 401, 402 and filling the vias with a conductive material, such as polysilicon or a metal such as Ni, Ti, W, Cu, Al or alloys thereof. In an embodiment, the interlevel dielectric layers 401, 402 and the dielectric layer 390 between adjacent pairs of memory stacks M1-M4 may be made of an oxide while the contact etch stops 320e may be made of silicon nitride. As such, the anisotropic etch used to form the vias may be chosen to selectively etch oxides versus nitrides. Therefore, the contact etch stops 320e will cause the vias to narrow as the dielectric layer 390 is removed. In this manner, the drain/source contact 400 may be self-aligned to the drain region DR while being more narrow than had the contact etch stops 320e not been used to self align the drain/source contact 400 with the drain regions DR. In this manner, the first split gate memory cell SGMC1 and the second split gate memory cell SGMC2 can be made closer to each other than if the drain contacts were not self aligned.

Figure 30:
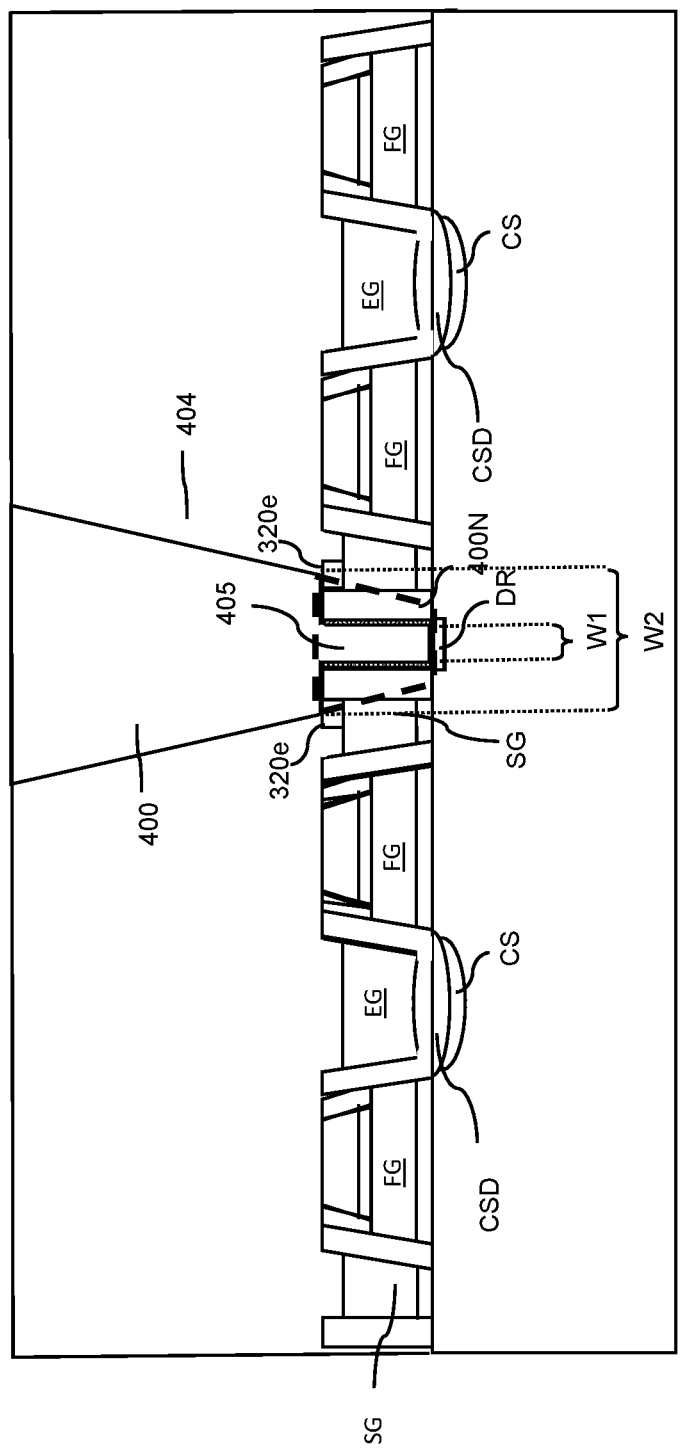
FIG. 30 is a close up of a portion of the vertical cross-sectional view of FIG. 29.

Referring to FIG. 30, a close up of the FIG. 29 is presented. As can be seen in FIG. 30, drain/source contact 400 comprises a first, wide portion 404 located above the contact etch stops 320e and a second, narrow portion 405 located adjacent to and below the contact etch stops 320e. That is, the drain/source contact 400 made using a self-aligned process results in a drain/source contact 400, which has a discontinuity in profile located at a contact etch stop 320e. Above the contact etch stop 320e, the drain/source contact 400 comprises the first portion 404, below the contact etch stop 320e, the drain/source contact 400 comprises the second portion 405. Thus, the drain contact may have a discontinuity in profile located at a contact etch stop 320e, above the first and second split gate memory cells (SGMC1 and SGMC2), wherein the drain/source contact 400 may have a first portion 404 above the etch stop and a second portion 405 below the contact etch stop 320e and the first portion 404 is wider than the second portion 405.

As illustrated in FIG. 30, the contact etch stop 320e and contact etch stop layer (CESL) formed on the main sidewall spacers MSW narrow the width of the etched vias. The width of the narrowed via using the contact etch stop 320e and contact etch stop layer (CESL) narrow the width of the via and subsequent drain/source contact 400 to W1. In contrast, a drain contact via and subsequent drain contact 400N formed without the contact etch stop 320e and contact etch stop layer CESL may be formed with a width W2.

Figure 31:
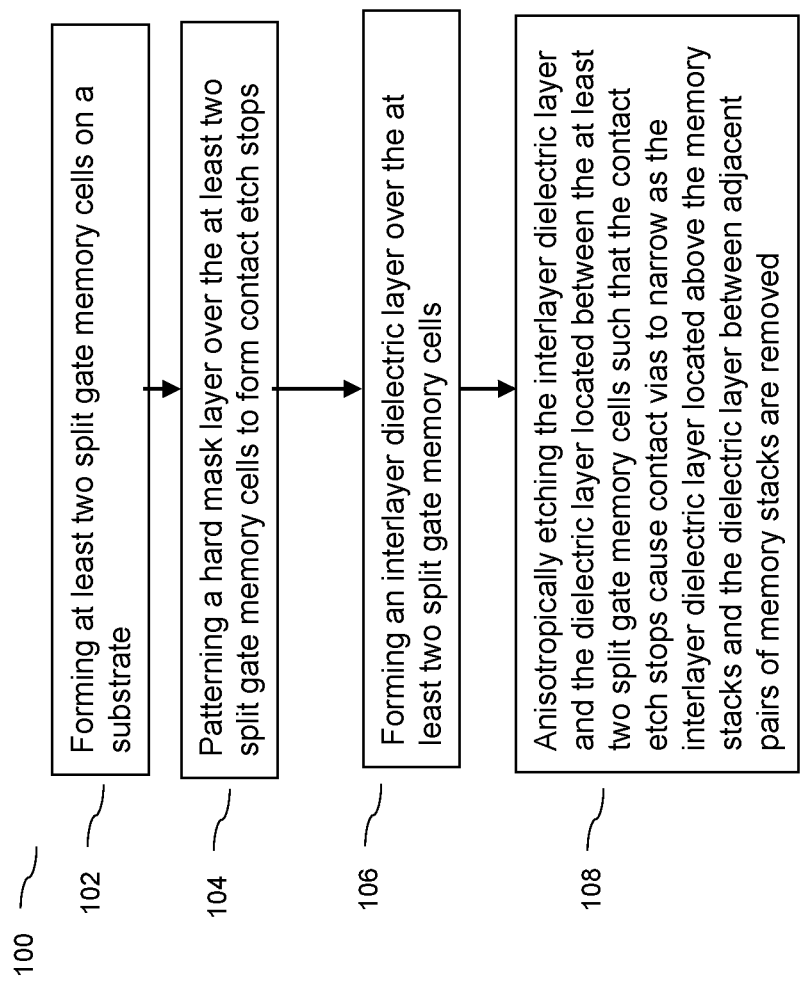
FIG. 31 is a flow chart of a method for fabricating a semiconductor device in accordance with some embodiments.

FIG. 31 is process flow chart of a method 100 for manufacturing a EFS3 memory device at different stages in accordance with some embodiments. Referring to FIG. 31 the method 100 begins at operation 102, forming at least two split gate memory cells SGMC1, SGMC2 on a substrate 210. The method 100 then proceeds to operation 104 in which the hard mask layer 320 may be patterned to subsequently form contact etch stops 320e. Then, the method 100 proceeds to operation 106 where interlevel dielectric layers 401, 402 may be formed over the substrate 210. Referring to FIG. 31, the method 100 proceeds to operation 108 in which an etching process may be performed to form vias to expose the drain regions DR and the source/drain regions SD1 and SD2. In an embodiment, the etching process comprises anisotropically etching the interlevel dielectric layers 401, 402 and the dielectric layer 390 located between the at least two split gate memory cells SGMC1, SGMC2 such that the contact etch stops 320e cause the drain contact vias to narrow as the interlevel dielectric layer 401 located above the two split gate memory cells SGMC1, SGMC2 and the dielectric layer 390 located between the at least two split gate memory cells SGMC1, SGMC2 are removed.

Embodiments of the present disclosure are drawn to flash memory structures with self-aligned drain contacts and methods of making these structures. Specifically, in the self-aligned process, a hard mask may be used in the fabrication of the split gate memory cells SGMC1, SGMC2 to form contact etch stops. The presence of the contact etch stops may reduce the width of the drain contact via (and ultimately the width of the drain contact) between the split gate memory cells SGMC1, SGMC2 that is formed through a selective etching process. By using a self-aligned process to make the drain contacts, EFS3 memory devices may be fabricated in which pairs of split gate memory cells SGMC1, SGMC2 of an EFS3 memory cell MC1 may be formed closer to adjacent pairs of split gate memory cells SGMC1, SGMC2 as compared to split gate memory cells of an EFS3 memory cell that are formed without using a self-aligned process and contact etch stops. Thus, the EFS3 memory device disclosed herein may operate faster than a conventionally formed EFS3 memory device because the carriers have a shorter distance to travel to and within the EFS3 memory cells MC1, MC2. Further, the disclosed embodiment EFS3 memory devices may be made smaller because the disclosed embodiment EFS3 memory cells MC1, MC2 may be formed closer to one another. In addition, the better alignment of the self-alignment process may produce and more reliable split gate memory cells SGMC1, SGMC2 than memory cells made without them.

An embodiment is drawn to a memory device including a first split gate memory cell SGMC 1 having a first memory stack MS located over a substrate 210. The first memory stack MS includes a first floating gate FG and a first control gate CG located above the first floating gate FG. The first split gate memory cell SGMC 1 also has a first select gate SG located adjacent to the first floating gate FG and the first control gate CG and a contact etch stop 320e located over a portion of a top surface of the first select gate SG.

Another embodiment is drawn to a memory device including a first split gate memory cell SGMC 1 on a substrate 210, a second split gate memory cell SGMC2 on a substrate 210 and a drain/source contact 400 located between the first and second split gate memory cells SGMC1, SGMC2 and electrically connecting to a drain region DR located in the substrate 210. The drain/source contact 400 has a discontinuity in profile located at a contact etch stop 320e above the first and second split gate memory cells SGMC1, SGMC2, wherein the drain/source contact 400 has a first portion above the contact etch stop 320e and a second portion below the contact etch stop 320e and the first portion is wider than the second portion.

Another embodiment is drawn to a method of making a memory device including the operations of forming at least two split gate memory cells (e.g., SGMC1, SGMC2) on a substrate 210. Each of the at least two split gate memory cells (e.g., SGMC1, SGMC2) include a pair of memory stacks (e.g., MS1, MS2) comprise a floating gate FG and a control gate CG located above the floating gate FG; a common source CS located between the pair of memory stacks (e.g., MS1, MS2); an erase gate EG located above the common source CS; select gates SG adjacent to each of the memory stacks (e.g., MS1, MS2), the select gates SG located opposite of the erase gate EG; and a dielectric layer located between the at least two split gate memory cells (e.g., SGMC1, SGMC2). The method of making the memory device further includes the operation of patterning a hard mask layer 320 over the at least two split gate memory cells (e.g., SGMC1, SGMC2) to form contact etch stops 320e over the select gates SG. The method further including the operation of forming an interlevel dielectric layer 401, 402 over the at least two split gate memory cells (e.g., SGMC1, SGMC2). The method of making the memory device further including the operation of anisotropically etching the interlevel dielectric layer 402 and the dielectric layer 390 located between the at least two split gate memory cells (e.g., SGMC1, SGMC2) such that the contact etch stops 320e cause drain contact vias to narrow as the interlevel dielectric layer 402 located above the at least two split gate memory cells (e.g., SGMC1, SGMC2) and the dielectric layer 390 located between the at least two split gate memory cells (e.g., SGMC1, SGMC2) may be removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a first split gate memory cell comprising:
      a first memory stack located over a substrate, the first memory stack comprising:
         a first floating gate; and
         a first control gate located above the first floating gate;
      a first select gate located adjacent to the first floating gate and the first control gate;
      a first contact etch stop located over a portion of a top surface of the first select gate;
      a first drain region adjacent to the first memory stack; and
      a first self-aligned drain contact contacting the first drain region and comprising a discontinuity in profile located at the first contact etch stop.

2. The memory device of claim 1, further comprising:
   a second memory stack located over the substrate, the second memory stack comprising:
      a second floating gate; and
      a second control gate located above the first floating gate;
   a second select gate located adjacent to the second floating gate and the second control gate; and
   a second contact etch stop located over a portion of a top surface of the second select gate.

3. The memory device of claim 2, further comprising a first erase gate located between the first and second memory stacks.

4. The memory device of claim 3, further comprising a common source located below the first erase gate.

5. The memory device of claim 4, further comprising:
   a second split gate memory cell comprising:
      a third memory stack located over a substrate, the second memory stack comprising:
         a third floating gate; and
         a third control gate located above the first floating gate;
      a third select gate located adjacent to the third floating gate and the third control gate;
      a third contact etch stop located over a portion of a top surface of the third select gate;
      a fourth memory stack located over a substrate, the second memory stack comprising:
         a fourth floating gate; and
         a fourth control gate located above the fourth floating gate;

a fourth select gate located adjacent to the fourth floating gate and the second control gate;

a fourth contact etch stop located over a portion of a top surface of a fourth select gate; and a second erase gate located between the located between the third and fourth memory stacks; and a second drain region located between the second memory stack and the third memory stack.

6. The memory device of claim 5, further comprising a second self-aligned drain contact contacting the second drain region.

7. The memory device of claim 6, wherein the second drain region comprises implanted ions.

8. The memory device of claim 6, wherein the second drain region comprises a self-aligned silicide.

9. The memory device of claim 6, wherein the first contact etch stop, the second contact etch stop, the third contact etch stop and the fourth contact etch stop each comprise silicon nitride.

10. The memory device of claim 6, further comprising:

a third drain region adjacent to the fourth memory stack; and a third self-aligned drain contact contacting the third drain region.

11. The memory device of claim 10, further comprising logic transistors in a peripheral region of the substrate.

12. A memory device comprising:

a first split gate memory cell comprising:
 a first memory stack;
 a first select gate located adjacent to the first memory stack; and
 a first contact etch stop located over the first select gate;

a second split gate memory cell comprising:
 a second memory stack;
 a second select gate located adjacent to the second memory stack; and
 a second contact etch stop located over the second select gate;

a drain region located between the first memory stack and the second memory stack; and a self-aligned drain contact contacting the drain region, wherein the self-aligned drain contact has a discontinuity in profile located at each of the first and second contact etch stops above the first and second select gates, and wherein the self-aligned drain contact has a first portion above the first and second contact etch stops above the first and second select gates and a second portion below the first and second contact etch stops above the first and second select gates and the first portion is wider than the second portion.

13. The memory device of claim 12, wherein sidewalls of the second portion of the self-aligned drain contact are substantially perpendicular to a top surface of the drain region.

14. The memory device of claim 13, wherein the first portion of the self-aligned drain contact has a varying diameter that is wider at a top surface of the first portion of the self-aligned drain contact.

15. A memory device comprising:

a first split gate memory cell on a substrate;

a second split gate memory cell on the substrate; and a drain contact located between the first split gate memory cell and the second split gate memory cell and electrically connecting to a drain region located in the substrate, wherein the drain contact has a discontinuity in profile located at a contact etch stop above the first split gate memory cell and the second split gate memory cell, wherein the drain contact has a first portion above the contact etch stop and a second portion below the contact etch stop and the first portion is wider than the second portion.

16. The memory device of claim 15, wherein the second portion of the drain contact has a constant diameter perpendicular to a surface of the substrate.

17. The memory device of claim 16, wherein the drain region is self-aligned.

18. The memory device of claim 15, wherein the substrate is a silicon on insulator substrate.

19. The memory device of claim 15, further comprising logic transistors in a peripheral region of the substrate.

20. The memory device of claim 15, wherein the contact etch stop comprises silicon nitride.

* * * * *